(12) United States Patent
Ouellet et al.

(10) Patent No.: US 7,365,016 B2
(45) Date of Patent: Apr. 29, 2008

(54) ANHYDROUS HF RELEASE OF PROCESS FOR MEMS DEVICES

(75) Inventors: Luc Ouellet, Granby (CA); Ghislain Migneault, Granby (CA); Jun Li, Montreal (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 149 days.

(21) Appl. No.: 11/314,535

(22) Filed: Dec. 22, 2005

(65) Prior Publication Data

US 2006/0211163 A1 Sep. 21, 2006

Related U.S. Application Data

(60) Provisional application No. 60/638,377, filed on Dec. 27, 2004.

(51) Int. Cl.
*H01L 21/302* (2006.01)
(52) U.S. Cl. ...................... 438/706; 438/723; 438/743; 216/73; 216/74
(58) Field of Classification Search ................ 438/704, 438/706, 723, 724; 216/73, 74
See application file for complete search history.

(56) References Cited

U.S. PATENT DOCUMENTS

| | | | | |
|---|---|---|---|---|
| 5,439,553 A | * | 8/1995 | Grant et al. .................. 216/58 |
| 5,814,562 A | * | 9/1998 | Green et al. ................. 438/708 |
| 6,576,151 B1 | * | 6/2003 | Vereecke et al. ............. 216/63 |
| 6,759,730 B2 | * | 7/2004 | Chaudhry et al. .......... 257/586 |
| 2003/0080082 A1 | * | 5/2003 | Chinn et al. .................... 216/2 |
| 2005/0002079 A1 | * | 1/2005 | Novotny et al. ............. 359/245 |

FOREIGN PATENT DOCUMENTS

WO       03/055791        7/2003

OTHER PUBLICATIONS

Lee C S et al: "Modeling and Characterization of Gas-Phase Etching of Thermal Oxide and TEOS Oxide Using Anhydrous HF and CH3OH" Journal of Electrochemical Society, Electrochemical Society Manchester, New Hampshire US vol. 143, No. 3, Mar. 1996 pp. 1099-1103, XP000952656 ISSN 0013-4651 p. 1101 col. 2.

* cited by examiner

*Primary Examiner*—Binh X. Tran
(74) *Attorney, Agent, or Firm*—Marks & Clerk; Richard J. Mitchell

(57) ABSTRACT

A method of etching a sacrificial oxide layer covering an etch-stop silicon nitride underlayer, involves exposing the sacrificial oxide to anhydrous HF at a temperature of less than about 100° C. and/or at vacuum level lower than 40 Torr; and subsequently performing an in-situ vacuum evaporation of etch by-products at a temperature of more than about 100° C. and at vacuum level lower than the 40 Torr without exposure to ambient air.

23 Claims, 27 Drawing Sheets

Before the release of a mechanical structure
via the removal of the sacrificial layer After the release of a mechanical structure
via the removal of the sacrificial layer

Figure 1
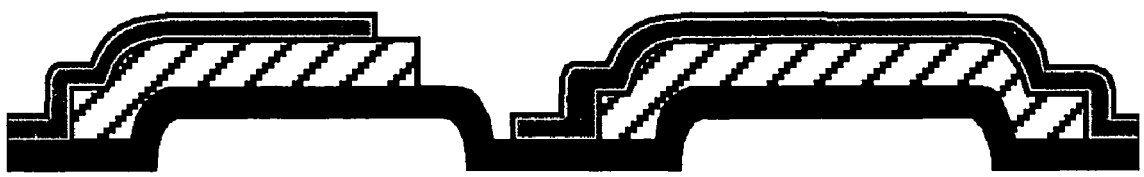
Before the release of a mechanical structure
via the removal of the sacrificial layer
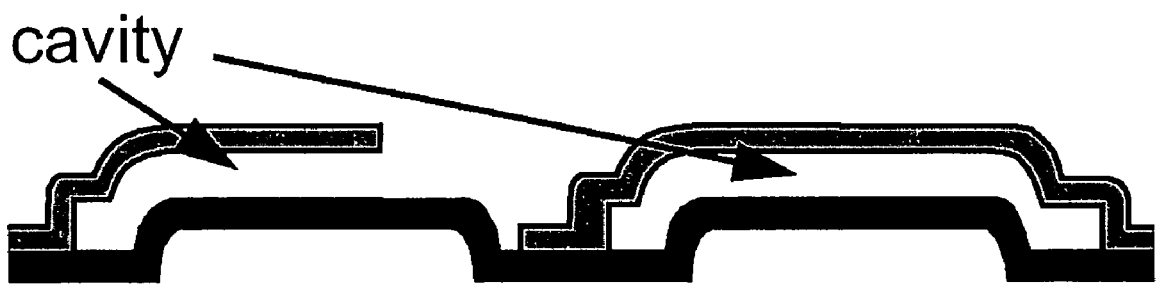
After the release of a mechanical structure
via the removal of the sacrificial layer

Figure 2
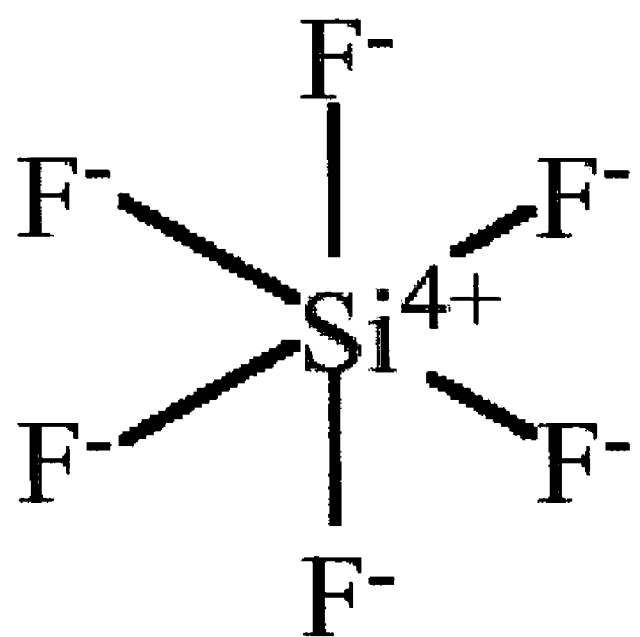

Figure 4
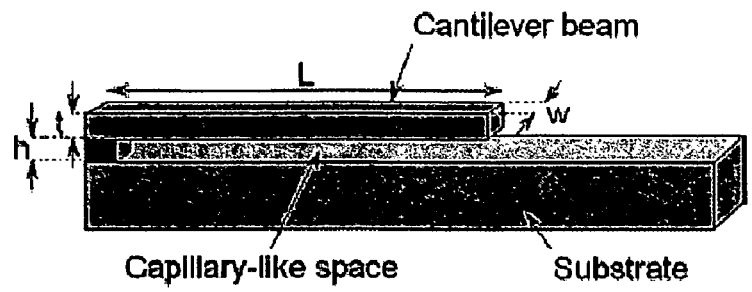
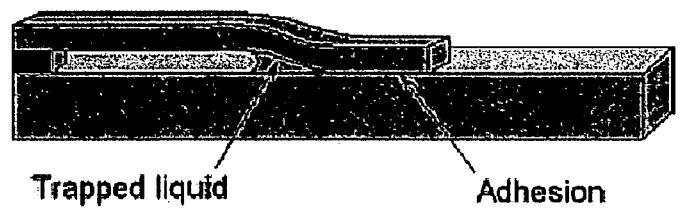
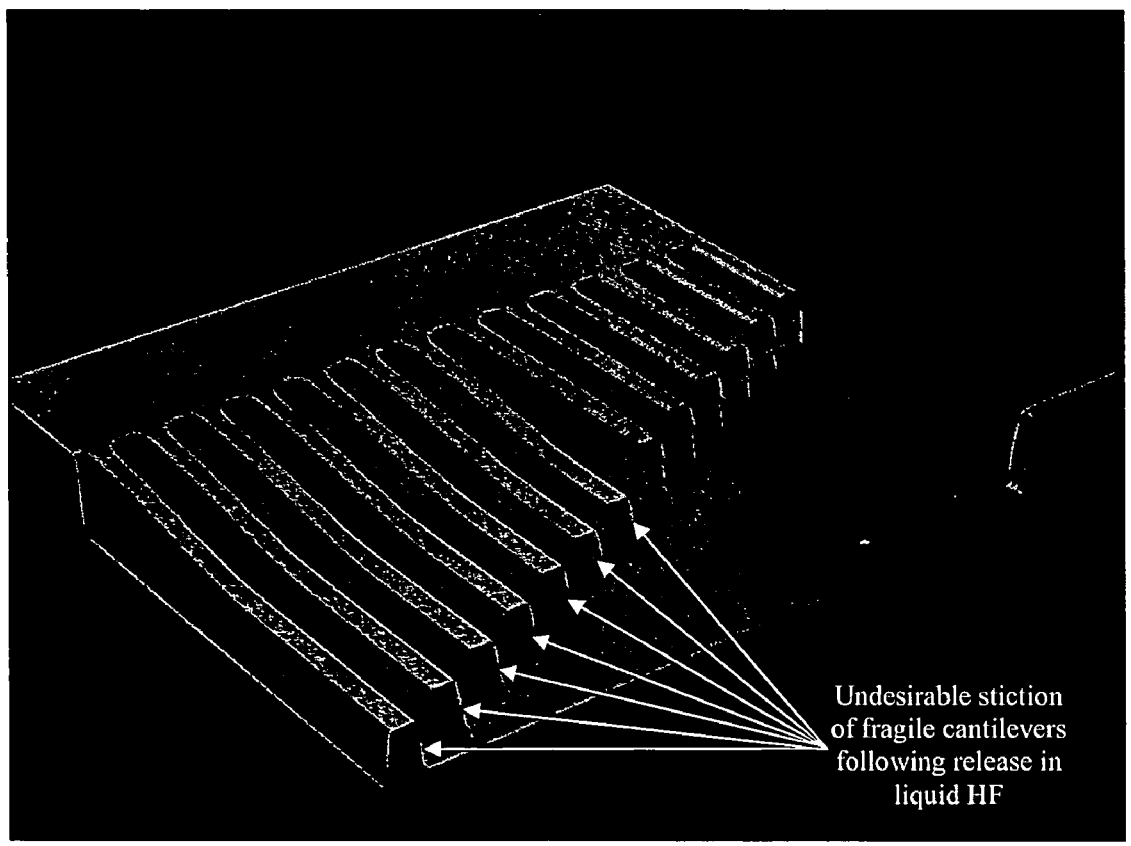
Undesirable stiction of fragile cantilevers following release in liquid HF

PRIOR ART

Figure 8
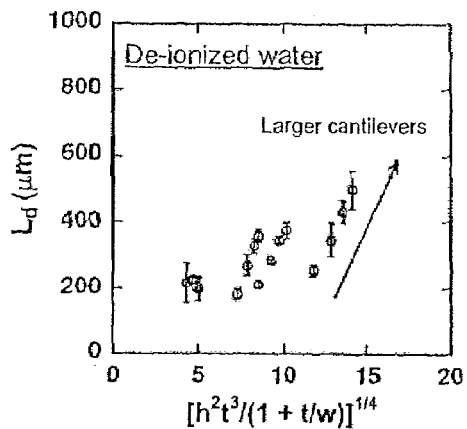
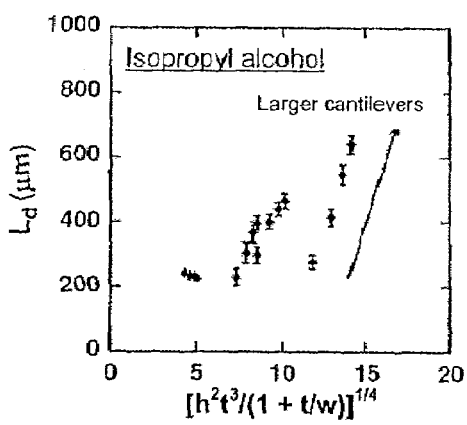
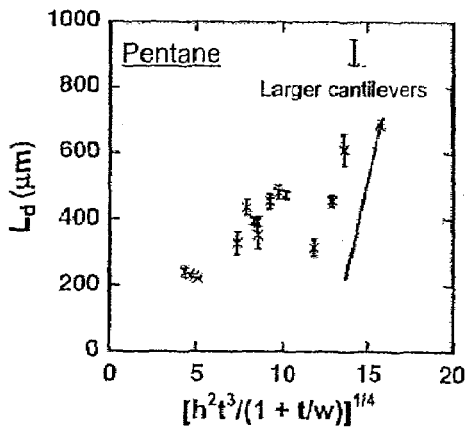
PRIOR ART

PRIOR ART

PRIOR ART

Figure 12
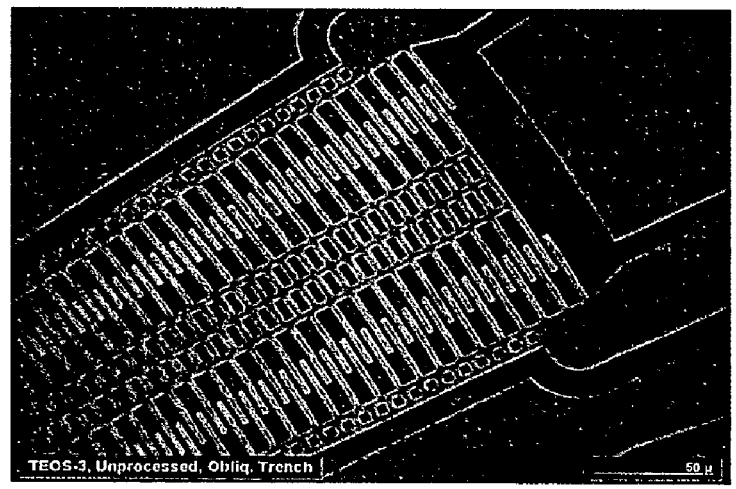
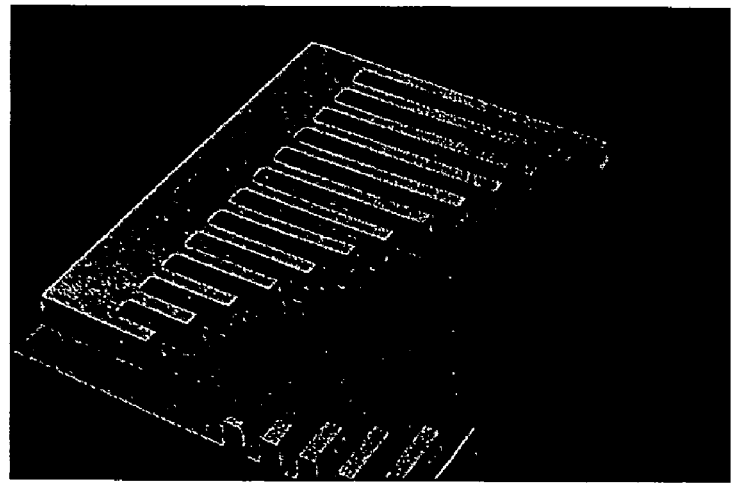

Figure 18
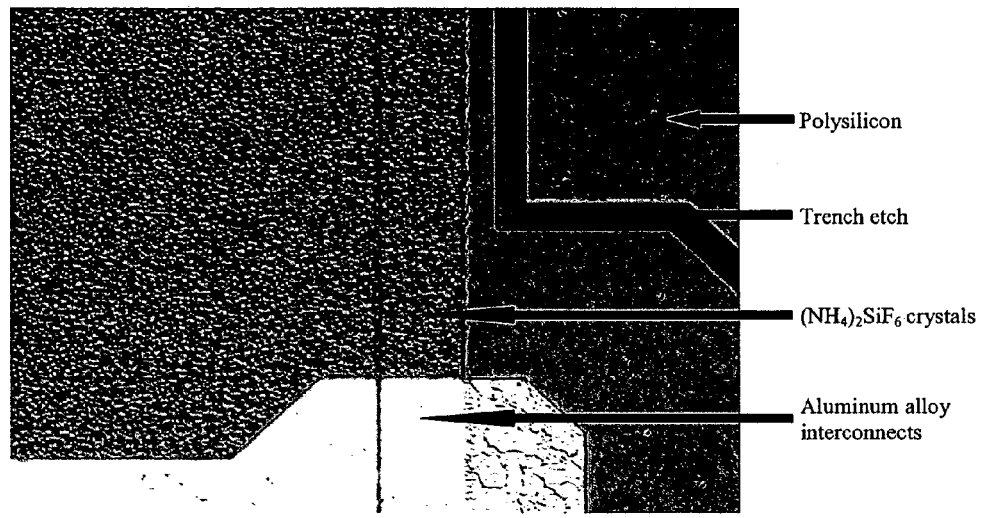
After anhydrous HF release and before evaporation in an oven
- Polysilicon
- Trench etch
- $(NH_4)_2SiF_6$ crystals
- Aluminum alloy interconnects
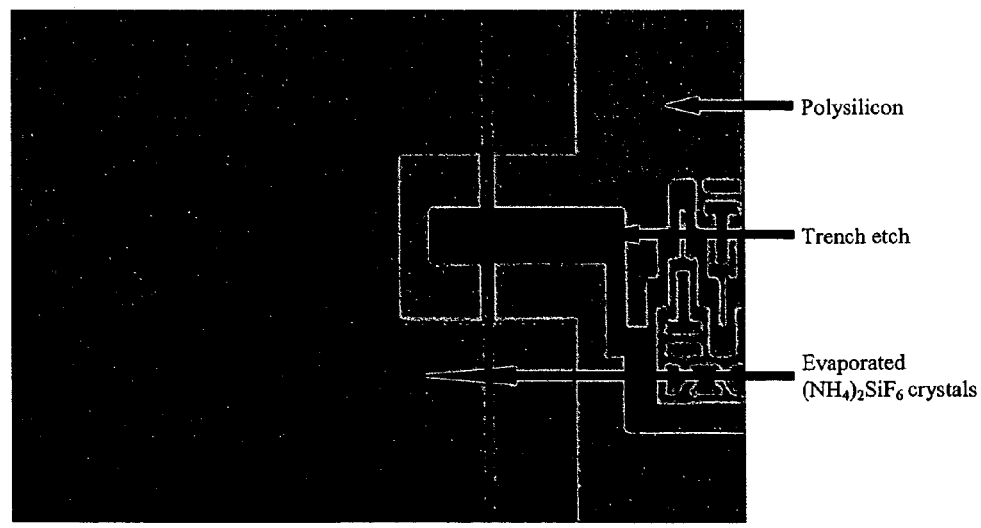
After anhydrous HF release and after evaporation in an oven
- Polysilicon
- Trench etch
- Evaporated $(NH_4)_2SiF_6$ crystals

Figure 22

Picture 1
Before exposure to anhydrous HF & solvent (or alcohol) additive process of the upper mentioned USA Patent 5,439,553. This shows the very clean surface of silicon nitride

Picture 2
After exposure to anhydrous HF & solvent (or alcohol) additive process of the upper mentioned USA Patent 5,439,553. This very rough surface covered by a random distribution of semi-evaporated droplets following the room temperature exposure to the vacuum required for SEM investigation. Note the quasi-sperical shape and individual size of the observed ammonium fluorosilicate, $(NH_4)_2SiF_6(s)$, ammonium bifluoride, $NH_4HF_2(s)$, or ammonium fluoride, $NH_4F(s)$, residues are indeed quite larger than the initial 0.2μm thickness of attacked silicon nitride, thus proving the droplet coalescence mechanism

Picture 3
After exposure to anhydrous HF & solvent (or alcohol) additive process of the upper mentioned USA Patent 5,439,553 and ex-situ oven evaporation at a temperature of more than 240°C under a nitrogen ambient at atmospheric pressure. Note the rough surface covered by a random shape and size distribution of residual ammonium fluorosilicate, $(NH_4)_2SiF_6(s)$, ammonium bifluoride, $NH_4HF_2(s)$, or ammonium fluoride, $NH_4F(s)$, crystals are indeed quite larger than the initial 0.2μm thickness of attacked silicon nitride, thus proving the droplet coalescence mechanism

PRIOR ART

PRIOR ART

PRIOR ART

ANHYDROUS HF RELEASE OF PROCESS FOR MEMS DEVICES

CROSS REFERENCE TO RELATED APPLICATION

This application claims the benefit under 35 USCC 119(e) of prior U.S. provisional application No. 60/638,377 filed Dec. 27, 2004, the contents of which are herein incorporated by reference.

FIELD OF THE INVENTION

This invention relates to a method of manufacturing of Micro-Electro-Mechanical-Systems (MEMS) such as micro-gyroscopes, micro-accelerometers, resonant accelerometers, micro-mirrors, micro-motors, micro-actuators and other such micro-devices.

BACKGROUND OF THE INVENTION

In the manufacture of MEMs device, the integration of very sensitive moving mechanical parts causes a very serious challenge because:
  These very sensitive mechanical parts are typically made of silicon (polysilicon or silicon-germanium);
  The sacrificial material underlying these mechanical parts to be released is typically silicon oxide;
  The etch-stop layer underlying this silicon oxide sacrificial layer is typically silicon nitride or silicon (polysilicon or silicon-germanium);
  The mechanical release of the mechanical parts requires the removal of the sacrificial material in liquid HF-based chemistries;
  The surface tension of these liquid HF-based chemistries is high enough to cause stiction of the released mechanical parts onto the underlayers of silicon nitride;

Liquid HF chemistries are not suitable for stiction-free releases of sensitive MEMS devices. Vapor HF has been used to release such devices without stiction. Unfortunately, vapor HF also attacks the underlying silicon nitride, producing an undesirable fluorinated silicon nitride compound with a rough surface. Fortunately, it has been reported that this fluorinated compound can be evaporated at high temperature using atmospheric pressure ovens operated under a nitrogen or inert ambient and/or at high temperature using vacuum ovens operated under a vacuum as to leave a clean surface under the removed sacrificial layer. Unfortunately, the fluorinated compound present onto the MEMS devices prior to such an ex-situ evaporation is indeed toxic and its manipulation involves the exposure of operators to this toxic fluorinated silicon nitride compound and/or to toxic vapors of this fluorinated silicon nitride compound resulting from its evaporation. More, the fluorinated compound is indeed unstable in presence of moist air and result in non-evaporable residues that cannot be evaporated in the ex-situ vacuum oven The design of a custom anhydrous HF chamber capable of anhydrous HF release at a high enough temperature and at a good enough vacuum can result in a residue-free release of the micro-devices integrating very sensitive moving mechanical parts. Similarily, such a custom anhydrous HF chamber capable of anhydrous HF release at a high enough temperature but at a vacuum level which is not yet low enough to prevent the formation of the toxic fluorinated silicon nitride residues but which is indeed capable of an in-situ evaporation of the toxic fluorinated silicon nitride residues can result in a safe operation and in a residue-free release of the micro-devices integrating very sensitive moving mechanical parts.

Stiction Issues with Liquid Buffered HF and Non-Buffered HF Solutions

Liquid buffered HF and non-buffered HF solutions have been used to mechanically release the sacrificial oxides underlying the silicon-based (polysilicon-based or silicon-germanium-based) structures, such as the ones shown in FIG. 1. The following references are cited as prior art covering liquid HF release processes:

G. Matamis, B. Gogoib, D. Monkb, A. McNeilb, V. Burrows, "Release etch modeling analysis and the use of Laser Scanning microscopy for etch time prediction of micromachined structures", Proc. of SPIE Vol. 4174, Micromachining and Microfabrication Process Technology VI, ed. J. Karam, J. Yasaitis (September 2000);

K. R. Williams, R. S. Muller, "Etch Rates for Micromachining Processing", Journal of Microelectromechanical Systems, Vol. 5, No. 4, December 1996, pp. 256-269;

K. R. Williams, K. Gupta, M. Wasilik, "Etch Rates for Micromachining Processing—Part II", Journal of Microelectromechanical Systems, Vol. 12, No. 6, December 2003, pp. 761-778;

J. Buhlery, F. P. Steiner, H. Baltes "Silicon Dioxide Sacrificial Layer Etching in Surface Micromachining", J. Micromech. Microeng. 7 (1997) R1-R13;

The above references show that HF solutions buffered with 40 wt % ammonium fluoride, $NH_4F$, can be used to remove the sacrificial layer of silicon dioxide, $SiO_2$, because the ammonium fluoride buffer maintains a stable pH and a stable release rate over time. Since ammonium fluoride has a melting point of 993° C. and a boiling point of 1700° C. it is then solid at room temperature. Since ammonium fluoride has a solubility limit of 40 grams/liter of water @ 15° C., it is typically used as a water-based ammonium fluoride solution, $NH_4F(aq.)$, at a concentration of 40 wt % NH4F in water. Since a 40 wt % NH4F has a pH of 6.0 and boiling point of 106° C., it is then liquid at room temperature. These buffered liquid HF solutions remove the sacrificial layer of silicon oxide, $SiO_2$, by producing the ammonium fluorosilicate, $(NH_4)_2SiF_6$, and more water solvent to dissolve the ammonium fluorosilicate by-product:

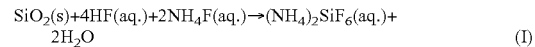
$$SiO_2(s) + 4HF(aq.) + 2NH_4F(aq.) \rightarrow (NH_4)_2SiF_6(aq.) + 2H_2O \quad (I)$$

The ammonium fluorosilicate (also called ammonium silicofluoride, ammonium fluosilicate, ammonium hexafluorosilicate or bararite) is a solid white cubic (2.011 g/cm$^3$) or triclinic (2.152 g/cm$^3$) crystal at room temperature. It has a high solubility of 250 grams/liter in water @ 20° C.:

$$(NH_4)_2SiF_6(aq.) \leftrightarrows 2NH_4^+(aq.) + SiF_6^{-2}(aq.)$$

This means that improperly rinsed BHF released wafers will result in an undesirable precipitation of solid ammonium fluorosilicate, $(NH_4)_2SiF_6$, crystals under the released mechanical parts. This clearly undesirable effect related to the use of BHF solutions is to be prevented in the manufacturing of MEMS devices.

The ammonium fluorosilicate decomposes at 100° C. and results in the formation of volatile ammonia, $NH_3$, of volatile silicon tetrafluoride, $SiF_4$, and of another undesirable white solid by-product, ammonium bifluoride, $NH_4HF_2$:

$$(NH_4)_2SiF_6(aq.) \rightarrow NH_4HF_2(aq.) + SiF_4(g) + NH_3(g)$$

Fortunately, ammonium bifluoride (also called ammonium hydrogendifluoride) has a solubility of 630 grams/liter in water @ 20° C.:

Ammonium bifluoride has a melting point of 125° C. and a decomposition temperature of 238° C.:

$NH_4HF_2(aq.) \rightarrow NH_4F(aq.) + HF(aq.)$

Because ammonium fluoride, $NH_4F$, has a melting point of 993° C., improperly rinsed mechanical parts released with BHF solutions and heated to high temperatures will also result in undesirable refractory solid residues accumulating under the improperly rinsed mechanical parts. Because advanced MEMS devices incorporating deep cavities and narrow access openings that cannot easily be rinsed, the use of BHF solutions in the manufacturing of such advanced MEMS devices gets much more complicated than the use of non-buffered HF solutions which do NOT result in the formation of such solid by-products.

The cited references also show that the non-buffered 49 wt % HF (in water) solution is used to remove the sacrificial layer of silicon oxide, $SiO_2$. This 49 wt % HF non-buffered solution (without $NH_4F$) has a boiling point of 106° C. and is then liquid at room temperature. The 49 wt % HF liquid solution removes the sacrificial layer of silicon oxide by producing the fluorosilicic acid, $H_2SiF_6$, and more water solvent to dissolve the fluorosilicic acid by-product:

$$SiO_2(s) + 6HF(aq.) \rightarrow H_2SiF_6(aq.) + 2H_2O \quad (I)$$

Since the fluorosilicic acid (also called hexafluorosilicic acid, hydrogen hexafluorosilicate, hydrofluorosilicic acid, dihydrogen hexafluorosilicate, hexafluorosilicate (2-) dihydrogen, hydrofluorosilicic acid, hydrogen hexafluorosilicate, hydrogen hexafluorosilic acid, sand acid, silicate (2-) hexafluorodihydrogen, silicic acid, silicofluoric acid, silicofluoride or silicon hexafluoride dihydride) has a melting point of −15.5° C. and a boiling point of 105° C., it is then liquid at room temperature. The fluorosilicic acid, $H_2SiF_6$, is very soluble in water:

FIG. 2 shows the chemical structure of the formed fluorosilicic acid liquid by-products in the solution.

As shown in FIG. 3, non-buffered liquid 49 wt % HF solution can very efficiently release rigid mechanical structures without any solid residues. In this FIG. 3, a machined device has been released by the removal of the local underlying oxide layer.

Unfortunately, the surface tension of liquid 49 wt % HF solution causes a very undesirable stiction effect on more flexible and more fragile mechanical parts than such rigid silicon blocks. FIG. 4 shows various 3D interferometric images of such an undesirable stiction effect on long and fragile cantilevers. Since advanced MEMS devices incorporate many such fragile mechanical parts prone to stiction it is necessary to eliminate this undesirable effect related to the use of liquid HF solutions.

The Physics of the Undesirable Stiction Effect Observed with Liquid HF Solutions FIG. 5 shows the shape of a liquid droplet deposited onto the surface of a given solid. From a thermodynamic standpoint, the work of adhesion of the interface is the amount of energy required to create free surfaces from the bonded materials:

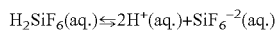

where $\gamma_{LA}$ and $\gamma_{SA}$ are the specific surface energies of the liquid and the solid in ambient air respectively and where $\gamma_{LS}$ is the interfacial energy between the solid and the liquid. The work of adhesion is often determined by contact angle measurements using a goniometer. If the tested liquid droplet is in thermodynamic equilibrium with the solid, then:

$\gamma_{SA} = \gamma_{LS} + \gamma_{LA} \cos \Theta$ where $\Theta$ is the contact angle between the liquid droplet and the solid surface. The work of adhesion now can be expressed with the Young-Dupré equation:

$W_A = \gamma_{LA} + \gamma_{LS} + \gamma_{LA} \cos \Theta - \gamma_{LS} = \gamma_{LA}(1 + \cos \Theta)$ The work of adhesion depends on the liquid surface tension ($\gamma_{LA}$) and the contact angle ($\Theta$). The following two cited references:

C. H. Mastrangelo, "Mechanical Stability and Adhesion of Microstructures Under Capillary Forces—Part I: Basic Theory", Journal of Microelectromechanical Systems, Vol. 2, No. 1, March 1993, pp. 33-43;

C. H. Mastrangelo, "Mechanical Stability and Adhesion of Microstructures Under Capillary Forces—Part II: Experiments", Journal of Microelectromechanical Systems, Vol. 2, No. 1, March 1993, pp. 44-55;

show that a cantilever beam shorter than a certain characteristic length called the detachment length, $L_d$, is stiff enough to free itself completely from the underlying material. In contrast, a cantilever beam longer than this detachment length, $L_d$, will not be stiff enough and will be pulled-down by the force generated by the surface tension of the liquid used for its mechanical release and will be stuck to the underlying material after the evaporation of this liquid. Using the nomenclature presented in FIG. 4, the following equation describes the relationship between the detachment length, the cantilever dimensions (t=thickness, l=length, w=width, h=height of sacrificial material), the cantilever's material properties (E=Young modulus), the liquid surface tension ($\gamma_{LA}$) and the measured contact angle ($\Theta$):

$$L_d = [2E/(9\gamma_{LA} \cos \Theta)]^{1/4} [h^2 t^3/(1+t/w)]^{1/4}$$

i.e. the detachment length, $L_d$, increases linearly as function of the cantilever's design characteristics $[h^2 t^3/(1+t/w)]^{1/4}$ with a slope $[2E/(9\gamma_{LA} \cos \Theta)]^{1/4}$ dictated by the Young modulus of the cantilever, the liquid surface tension ($\gamma_{LA}$) and the measured contact angle ($\Theta$). It is then predicted that the detachment length ($L_d$) of a cantilever (t, l, w) made of a material of a Young Modulus, E, mechanically released over a sacrificial layer (h) will be shorter when mechanically released by a liquid having a larger surface tension ($\gamma_{LA}$) and larger contact angle ($\Theta$).

The 3D interferometric image of FIG. 4 shows a very clear demonstration of the relatively short detachment length ($L_d$) of cantilevers released in a non-buffered 49 wt % HF solution.

The chemicals used to remove the sacrificial oxide layer over the underlying surface of silicon, silicon nitride or other non-removed layer dictate the behavior of the various exposed surfaces in liquid water i.e. dictates if these become hydrophilic or hydrophobic surfaces.

FIG. 6 is a reprint of the upper-cited C. H. Mastrangelo reference. It shows the linear relationship between the measured detachment length, $L_d$, of cantilevers and the cantilever's design characteristics $[h^2 t^3/(1+t/w)]^{1/4}$ for hydrophobic (water rinse after mechanical release in HF solutions) and hydrophilic (water rinse after sulphuric acid & hydrogen peroxide exposure after mechanical release in HF solutions) cantilevers. This FIG. 6 shows that there is basically very little difference between measured detachment length, $L_d$, of hydrophilic and hydrophobic cantilevers.

When the mechanical release of the mechanical parts is done in a non-buffered 49 wt % HF solution, a final rinse in de-ionized water is performed to stop the release and to eliminate the residual H$^+$ and F$^-$ ions from the exposed surfaces. The following reference:

D. R. Ride, "Handbook of Chemistry and Physics", 71th Edition, 1991, CRC Press, Boca Raton, Fla., USA;

shows that de-ionized water has a surface tension of 73.05 mN/m at a temperature of 20° C. The high surface tension is limitative to achieve the long detachment length, $L_d$, required for fragile mechanical parts composing advanced MEMS devices. Other chemicals than de-ionized water having lower surface tension, $\gamma_{LA}$, should be used to achieve better resistance to stiction (i.e. lower work of adhesion, $W_A$, and longer detachment length, $L_d$).

Stiction Reduction using Lower Surface Tension Liquids

Lower surface tension liquids have been used to try minimizing the stiction effect. The following reference:

O. Raccurt, F. Tardif, F. Arnaud d'Avitaya, T. Vareine, "Influence of liquid surface tension on stiction of SOI MEMS", Journal of Micromechanics and Microengineering, Vol. 14, (2004) 1083-1090 is used as prior art reference to demonstrate that lower surface tension liquids slightly help minimizing the undesirable stiction effect. It compares the detachment length, $L_d$, of various silicon cantilevers released from their underlying oxide using either:

De-ionized water, having a high surface tension, $\gamma_{LA}$, of $73.1 \times 10^{-3}$ N/m;

Isopropyl alcohol, having a mid surface tension, $\gamma_{LA}$, of $21.7 \times 10^{-3}$ N/m;

Pentane, having a very low surface tension, $\gamma_{LA}$, of $13.7 \times 10^{-3}$ N/m;

In order to verify the effect of the surface tension, $\gamma_{LA}$, on the detachment length, $L_d$:

$$L_d = [2E/(9\gamma_{LA} \cos \Theta)]^{1/4} [h^2 t^3/(1+t/w)]^{1/4}$$

four types of SOI substrates have been used to machine cantilevers of various length:

SOI substrate #1: top silicon thickness, t, of 20.0 µm over 0.5 µm sacrificial oxide, h;

SOI substrate #2: top silicon thickness, t, of 15.0 µm over 2.0 µm sacrificial oxide, h;

SOI substrate #3: top silicon thickness, t, of 20.0 µm over 2.0 µm sacrificial oxide, h;

SOI substrate #4: top silicon thickness, t, of 20.0 µm over 3.0 µm sacrificial oxide, h;

This reference shows that the various cantilevers are machined in the top silicon region (Young modulus of 170 GPa) as to reach the bottom sacrificial oxide. Following proper resist strip, the cantilevers are released from their underlying oxide using a non-buffered 49 wt % HF solution followed by a rapid displacement of the 49 wt % HF releasing solution using either:

De-ionized water;
Isopropyl alcohol;
Pentane;

FIG. 7 is a reprint of the upper cited O. Raccurt reference. This FIG. 7 shows the set-up used by this cited reference to ensure this rapid replacement of the non-buffered 49 wt % HF solution by de-ionized water and then the replacement of this de-ionized water by either one of:

De-ionized water;
Isopropyl alcohol;
Pentane.

This FIG. 7 shows that the steps a) to h) of releasing, rinsing and drying the various cantilevers machined in the four types of SOI wafers are performed in the same bath without liquid/gas interface:

a) & b) Releasing of the cantilevers by etching the sacrificial layer in 49 wt % HF;

c) Stop etching the sacrificial oxide using a "piston" flow of de-ionized water removing the 49 wt % HF by overflow;

d) Rinsing using recirculation;

e) Rinse using a "piston" flow of de-ionized water removing the recirculated de-ionized water by overflow;

f) Introduction of either isopropyl alcohol or pentane onto the de-ionized water;

g) SOI wafer drying by displacement through the layer of either isopropyl alcohol or pentane;

h) Recovery of the drying liquid by overflow.

FIG. 8 is also reprint of the cited O. Raccurt reference. This FIG. 8 shows the observed effect of the surface tension of the drying liquid on the detachment length, $L_d$, of the various cantilevers machined in the four types of SOI substrates. It appears that there is not that much differences between the detachment length, $L_d$, and the surface tension of the drying liquid for three out of four types of SOI substrates. For the fourth type of SOI substrate, there is an increase of the detachment length, $L_d$, using lower surface tension pentane as replacement of de-ionized water.

Such small differences of detachment length, $L_d$, of sensitive mechanical parts using smaller surface tension drying liquids do not fulfill the requirements for most advanced MEMS devices integrating a large number of sensitive mechanical parts and does not safely prevent the stiction issues associated with such type of devices.

Another technique is to be used to prevent stiction of such advanced MEMS devices.

Stiction Reduction using Super-Critical $CO_2$ Drying

Super-critical $CO_2$ drying has been used to try minimizing the stiction effect. The following references:

J. J. Sniegowski, C. Smith, "An Application of Mechanical Leverage to Microactuation", 8th International Conference on Solid-State Sensors and Actuators, and Eurosensors IX, Proc., Transdiucers '95 Eurosensors IX, Stockholm, Sweden, Vol. 2, Jun. 25-29, 1995, pp. 364-367;

J. W. Judy, R. S. Muller, "Batch-Fabricated, Addressable, Magnetically Actuated Microstructures", Technical Digest, Solid-State Sensor and Actuator Workshop, Hilton Head Island, SC, Jun. 3-6, 1996;

C. W. Dyck, J. H. Smith, S. L. Miller, E. M. Russick, C. L. J. Adkins, "Supercritical carbon dioxide solvent extraction from surface-micromachined micromechanical structures", SPIE Micromachining and Microfabrication, October, 1996;

C. H. Mastrangelo, "Adhesion-related failure mechanisms in micromechanical device" Tribology Letters, Vol. 3, No. 3, June 1997, pp. 223-238;

C. J. Kim, J. Y. Kim, B. Sridharan, "Comparative Evaluation of Drying Techniques for Surface Micromachining", Sensors and Actuators, A 64, 1998, pp. 17-26;

L. Lin, R. T. Howe, A. P. Pisano, "Microelectromechanical Filters for Signal Processing", Journal of Micromechanical Systems, Vol. 7, No. 3, September 1998, pp. 286-294;

J. Zou, C. Liu, J. Chen, S. M. Kang, "Development of a Wide Tuning Range MEMS Tunable Capacitor for Wireless Communication Systems," IEEE IEDM, 2000, pp. 403-406;

L. Lin, "MEMS Post-Packaging by Localized Heating and Bonding", IEEE Transactions on Advanced Packaging, Vol. 23, No. 4, November 2000, pp. 608-616;

N. Hoivik, Y. C. Lee, V. M. Bright, "Flip Chip Variable High-Q MEMS Capacitor for RF Applications, Proceedings of IPACK'01, The Pacific RIM/ASME International Electronic Packaging Technical Conference and Exhibition, Kauai, Hi., USA, Jul. 8-13, 2001;

W. I. Jang, C. A. Choi, M. L. Lee, C. H. Jun, Y. T. Kim, "Fabrication of MEMS devices by using anhydrous HF gas-phase etching with alcoholic vapor", Journal of Micromechanics and Microengineering, Vol. 12, 2002, pp. 297-306;

are used as cited prior art to demonstrate that the supercritical $CO_2$ drying helps minimizing the undesirable stiction effect. The supercritical drying technique uses $CO_2$ as the supercritical fluid because of its relatively low supercritical pressure (1073 psi) and temperature (31.1° C.). The steps involved in the supercritical $CO_2$ drying of released microstructures are:

Release by immersion in liquid HF solutions;

Surface passivation of the released silicon structure by immersion in a sulfuric peroxide or in a hydrogen peroxide solution, thus resulting in hydrophilic silicon surfaces;

Thorough de-ionized water rinses followed by a solvent or a alcohol soak to displace the water;

Placement of the solvent- or alcohol-soaked samples in a supercritical drying chamber for drying. Once in the pressure vessel, the solvent or alcohol is completely displaced by liquid $CO_2$ at a pressure of about 1200 psi, then at a pressure higher than the supercritical pressure of 1073 psi.

FIG. 9 shows the mechanism behind the super-critical $CO_2$ drying. Drying takes place by passing from the liquid phase to the gas phase through the supercritical region and above the supercritical point (31.1° C., 1073 psi):

First, the $CO_2$-pressurized vessel is heated until the liquid $CO_2$ makes the transition to the supercritical phase (T>31.3° C.);

Venting the vessel to rapidly reduce the pressure isothermally above the $CO_2$ supercritical temperature results in dried "stiction-free" surfaces.

Because the liquid-to-vapor transition occurs in the supercritical region, there are no attractive capillary forces to cause stiction during the drying phase.

This supercritical $CO_2$ drying technique is not that well suited for mass production because the high pressure of about 1200 psi (required to dry the released structures by passing from the liquid phase to the gas phase through the supercritical region and above the supercritical point of 31.1° C. and 1073 psi) imposes the use of bulky and thick walls mechanical chambers to manually load and dry, one-by-one, the solvent-soaking substrates integrating advanced MEMS devices having their sensitive mechanical parts already released and yet dripping solvent. The most advanced supercritical $CO_2$ dryer currently available is the "Automegasamdri®-915 Series C" from Tousamis:

http://tousimis.com/Specs/8785D.pdf

FIG. 10 shows the picture of this system and clearly demonstrates the automation and mass production limitations of this supercritical $CO_2$ drying technique which imposes the manually loading, one-by-one, of yet solvent-soaking substrates.

Incompatibility of Standard CMOS Metals to Liquid HF

The above-mentioned release techniques involving liquid HF suffer from either stiction complications or lack of automation, thus limiting the mass production of advanced MEMS devices integrating sensitive mechanical parts.

Over these very serious problems, liquid-based HF solutions also suffer from metal incompatibility issues. These incompatibility issues are due to the fact that advanced MEMS devices typically integrate digital and/or analog CMOS control logic and/or high voltage CMOS drivers capable of performing actuation functions. Since this CMOS electronics needs to be exposed to the chemicals used for the removal of the oxide sacrificial material to allow the release the mechanical parts of these advanced MEMS devices, the liquid-based HF solutions should not chemically attack the metal-based interconnections of this CMOS electronics. Unfortunately almost all CMOS interconnect materials, namely aluminum alloys (such as aluminum-silicon, aluminum-copper or aluminum-silicon-copper alloys), titanium (and titanium compounds such as titanium nitride) and copper are rapidly attacked by these liquid-based HF solutions. The following documents are used as prior art references to demonstrate these undesirable limitations:

K. R. Williams, R. S. Muller, "Etch Rate for Micromachining Processing", Journal of Micromechanical Systems, Vol. 5, No. 4, December 1996, pp. 256-294;

A. Witvrouw, B. Du Bois, P. De Moor, A. Verbist, C. Van Hoof, H. Bender, K. Baert, "A comparison between wet HF etching and vapor HF etching for sacrificial oxide removal", Proc. SPIE Micromachining and Microfabrication Process Technology VI; September, 2000, Vol. 4174, 2000, pp. 130-141;

K. R. Williams, K. Gupta, "Etch Rate for Micromachining Processing—Part II", Journal of Micromechanical Systems, Vol. 12, No. 6, December 2003, pp. 761-778;

This clearly limits the use of liquid-based HF solutions for the mass production of advanced MEMS devices integrating digital and/or analog CMOS control logic and/or high voltage CMOS drivers capable of performing actuation functions.

SUMMARY OF THE INVENTION

Embodiments of the invention provide an integrated process involving the use of anhydrous HF and either a methanol, isopropanol, acetone, 1-butanol or 2-butanol additive to release MEMS devices at a temperature of less than 100° C. and at vacuum level greater than the ammonium bifluoride, $NH_4HF_2$, triple point pressure of about 40 Torr followed by an in-situ vacuum evaporation at a temperature of more than 100° C. and at vacuum level lower than the ammonium bifluoride, $NH_4HF_2$, triple point pressure of about 40 Torr as a way to achieve an operator-safe, residue-free and stiction-free release of MEMS micro-devices integrating very sensitive moving mechanical parts, digital and/or analog CMOS control logic and/or high voltage CMOS drivers capable of performing actuation functions.

According to one aspect of the invention there is provided a method of etching a sacrificial oxide layer covering an etch-stop silicon nitride underlayer, comprising exposing the sacrificial oxide to anhydrous HF at a temperature of less than about 100° C. and at vacuum level greater than 40 Torr; and subsequently performing an in-situ vacuum evaporation of etch by-products at a temperature of more than about 100° C. and at vacuum level lower than the 40 Torr without exposure to ambient air.

The invention offers an improvement over the vapor HF presently used to protect against stiction complications.

Since the mechanical deformation and resulting stiction of sensitive microstructures are caused by the pulling action (surface tension) of the liquids as they are dried from the surfaces of these microstructures, an alternate approach using vapor HF (gas phase $H_2O$/HF solutions) was proposed in the Prior Art. The following eight documents are cited as prior art references for the stiction-free release of advanced MEMS devices integrating sensitive mechanical parts prone to stiction:

- R. S. Blackwood, R. L. Biggerstaff, L. D. Clements, R. Cleavelin, "Gaseous Process and Apparatus for Removing Films from Substrates", U.S. Pat. No. 4,749,440, Jun. 7, 1988;
- M. Tanaka, "Surface Treating Apparatus and Method Using Vapor", U.S. Pat. No. 5,174,855, Dec. 29, 1992;
- H. Watanabe, H. Kitajima, I. Honma, H. Ono, R. J. Wilhelm, A. J. L. Sophie, "Influence of Water Adsorption/Desorption Processes on the Selectivity of Vapor HF Processes", J. Electrochem Soc., Vol.142, No. 4, April 1995, pp. 1332-1340;
- B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620);
- A. Witvrouw, B. Du Bois, P. De Moor, A. Verbist, C. Van Hoof, H. Bender, K. Baert, "A comparison between wet HF etching and vapor HF etching for sacrificial oxide removal", Proc. SPIE Micromachining and Microfabrication Process Technology VI; September 2000, Vol. 4174, 2000, pp. 130-141;
- R. C. Cole, R. E. Robertson, A. D. Yarbrough M. Tanaka, "Method of Vapor HF Release of Microstructures", U.S. Pat. No. 6,238,580, May 29, 2001;
- M. A. Lester, "Selective Material Removal for Nanostructure Formation", Semiconductor International, Jun. 1, 2003;

These eight references and in particular A. Witvrouw''s and M. A. Lester's references show that the metal incompatibility is still a problem with the vapor HF process (mostly performed using FSI International's Excalibur® 2000 Vapor HF Etching System of FIG. 11—http://www.f-sa.org/directories/suppliers/profile.asp?id=617): the reported experiments show that although vapor HF process conditions can be adjusted to achieve selective removal of oxide sacrificial layers films without stiction and collapse of polysilicon structures, the aluminum, titanium and copper layers are indeed seriously attacked during the removal of the sacrificial oxide layers using non-anhydrous vapor HF.

This incompatibility of the vapor HF process and the typical CMOS interconnects metals again clearly limits the use of vapor HF solutions for the mass production of advanced MEMS devices integrating digital and/or analog CMOS control logic and/or high voltage CMOS drivers capable of performing actuation functions.

The invention is an improvement over the anhydrous HF mixed with solvent or alcohol additives presently used to protect against stiction and CMOS metal interconnects attack complications The removal of a solid phase sacrificial oxide layer, $SiO_2(s)$, using a gas phase anhydrous vapor hydrofluoric acid, $HF(g)$, produces a gas phase silicon tetrafluoride, $SiF_4(g)\uparrow$, and gas phase water vapor, $H_2O(g)\uparrow$:

$$SiO_2(s)+4HF(g)\rightarrow SiF_4(g)\uparrow+2H_2O(g)\uparrow$$

Silicon tetrafluoride, $SiF_4$, also called silicon (IV) fluoride or silicon fluoride or tetrafluorosilane has a melting point of −90° C. and a boiling point of −86° C. It is then a gas at room temperature. The water vapor reaction by-product needs to be eliminated from the surrounding of the sacrificial layer as to prevent the undesirable metal incompatibility effects described in the previous section. The elimination of the water vapor by-product is possible via the use of a solvent (or alcohol) additive that offers a way to prevent the condensation of the water vapor by-product of the upper chemical reaction onto the released mechanical surfaces and the surrounding surfaces i.e. a way to prevent against the initial stage of a possible stiction complication:

- J. Ruzyllo, K. Torek, C. Draffon, R. Grant, R. Novak, "Etching of Thermal Oxides in Low Pressure Anhydrous HF/$CH_3OH$ Gas Mixtures at Elevated Temperatures", J. Electrochem Soc., Vol. 140, No. 4, April 1993, pp. L64-L66;
- K. Torek, J. Ruzyllo, R. Grant, R. Novak, "Reduced Pressure Etching of Thermal Oxides in Anhydrous HF/Alcoholic Gas Mixtures", J. Electrochem Soc., Vol. 142, No. 4, April 1995, pp. 1322-1326;
- R. W. Grant, J. Ruzyllo, K. Torek, "Controlled Etching of Oxides via Gas Phase reactions", U.S. Pat. No. 5,439,553, Aug. 8, 1995;
- C. S. Lee, J. T. Baek, H. J. Yoo, S. E. Woo, "Modeling and Characterization of Gas-Phase Etching of Thermal Oxide and TEOS Oxide Using Anhydrous HF and $CH_3OH$", J. Electrochem Soc., Vol. 143, No. 3, March 1996. pp. 1099-1103;
- H. H. Chung, W. I. Jang, C. S. Lee, J. H. Lee, H. J. Yoo, "Gas-phase Etching of TEOS and PSG Sacricial Layers using Anhydrous HF and $CH_3OH$", Journal of the Korean Physical Society, Vol. 30, No. 3, June 1997, pp. 628-631;
- J. H. Lee, W. I. Jang, C. S. Lee, Y. I. Lee, C. A. Choi, J. T. Baek, H. J. Yoo, "Characterization of Anhydrous HF Gas-Phase Etching with $CH_3OH$ for Sacrificial Oxide Removal", Sensors and Actuators, A64, 1998, pp. 27-32;
- A. J. Muscat, A. G. Thorsness, G. Montano-Miranda, "Characterization of Residues Formed by Anhydrous Hydrogen Fluoride Etching of Doped Oxides", J. Vac. Sci. Technol. A19(4), July-August 2001, pp. 1854-1861;
- W. I. Jang, C. A. Choi, M. L. Lee, C. H. Jun, Y. T. Kim, "Fabrication of MEMS Devices by Using Anhydrous HF Gas-phase Etching With Alcoholic Vapor", Journal of Micromechanics and Microengineering, 12, 2002, pp. 297-306;
- K. Shimaoka, J. Sakata, "A New Full-Dry Processing Method for MEMS", R&D Review of Toyota CRDL Vol. 37 No. 3, September 2002, pp. 59-66;

The resulting is a good gas phase release process free from stiction complications.

BRIEF DESCRIPTION OF THE DRAWINGS

The invention will now be described in more detail, by way of example only, with reference to the accompanying drawings, in which:

FIG. 1 shows the release of a mechanical structure via the removal of the sacrificial layer;

FIG. 2 shows fluorosilicic acid;

FIG. 4 shows the undesirable stiction effect observed during the mechanical release of long and fragile cantilevers;

FIG. 8 shows the effect of the surface tension of the drying liquid on the detachment length, $L_d$, of various cantilevers (Reprint of O. Raccurt's);

FIG. 12 shows the various mechanical structures properly released without any stiction using a anhydrous HF process;

FIG. 18 shows top view of optical pictures of a MEMS device following its mechanical release using a anhydrous HF process, before and after a few minutes evaporation to an oven under a nitrogen ambient at a temperature of more than 240° C. at atmospheric pressure;

FIG. 22 shows the non-evaporated residues observed for air-exposed and ex-situ evaporated ammonium fluorosilicate crystals into an ex-situ oven operated at a temperature of more than 240° C. under nitrogen ambient at atmospheric pressure;

DETAILED DESCRIPTION OF THE PREFERRED EMBODIMENTS

FIG. 12 shows various mechanical structures properly released without any stiction using anhydrous HF & solvent (or alcohol) additive process of the upper mentioned U.S. Pat. No. 5,439,553. The desirable advantage of this anhydrous HF & solvent (or alcohol) additive process over the standard anhydrous HF process resides in the metal compatibility with standard CMOS interconnect materials (aluminum and aluminum alloys, titanium and titanium compounds as well as copper).

Figure 3:
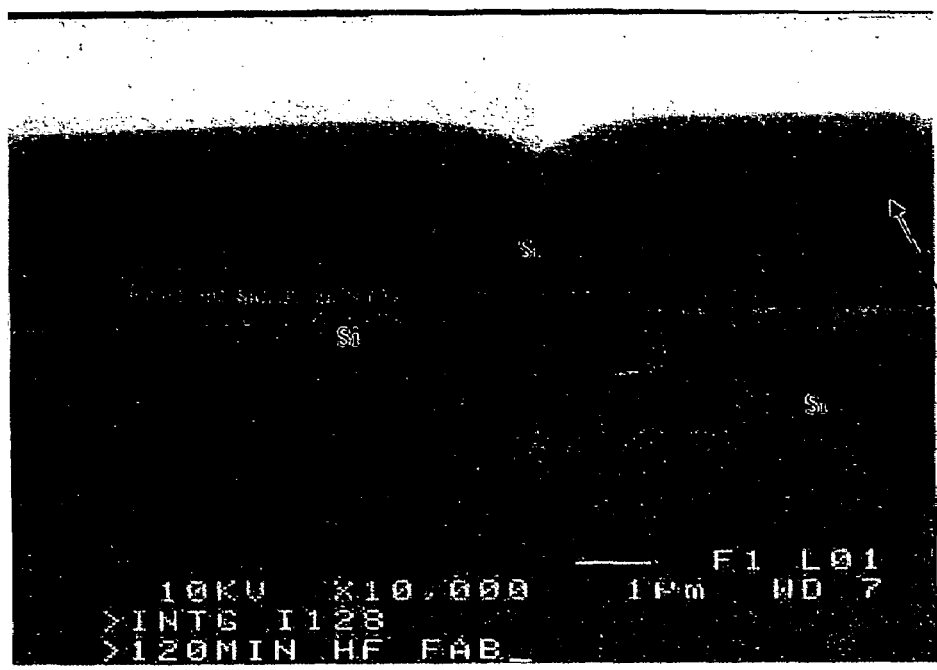
FIG. 3 shows the release of mechanical structure following liquid HF removal of underlying sacrificial oxide layer.
Figure 5:
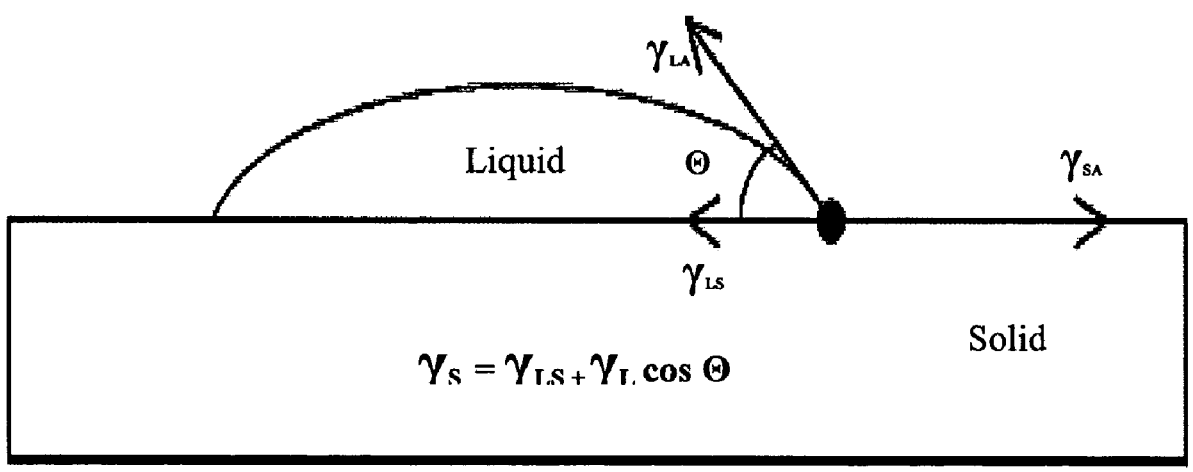
FIG. 5 shows the shape of a droplet liquid deposited onto the surface of a given solid.
Figure 6:
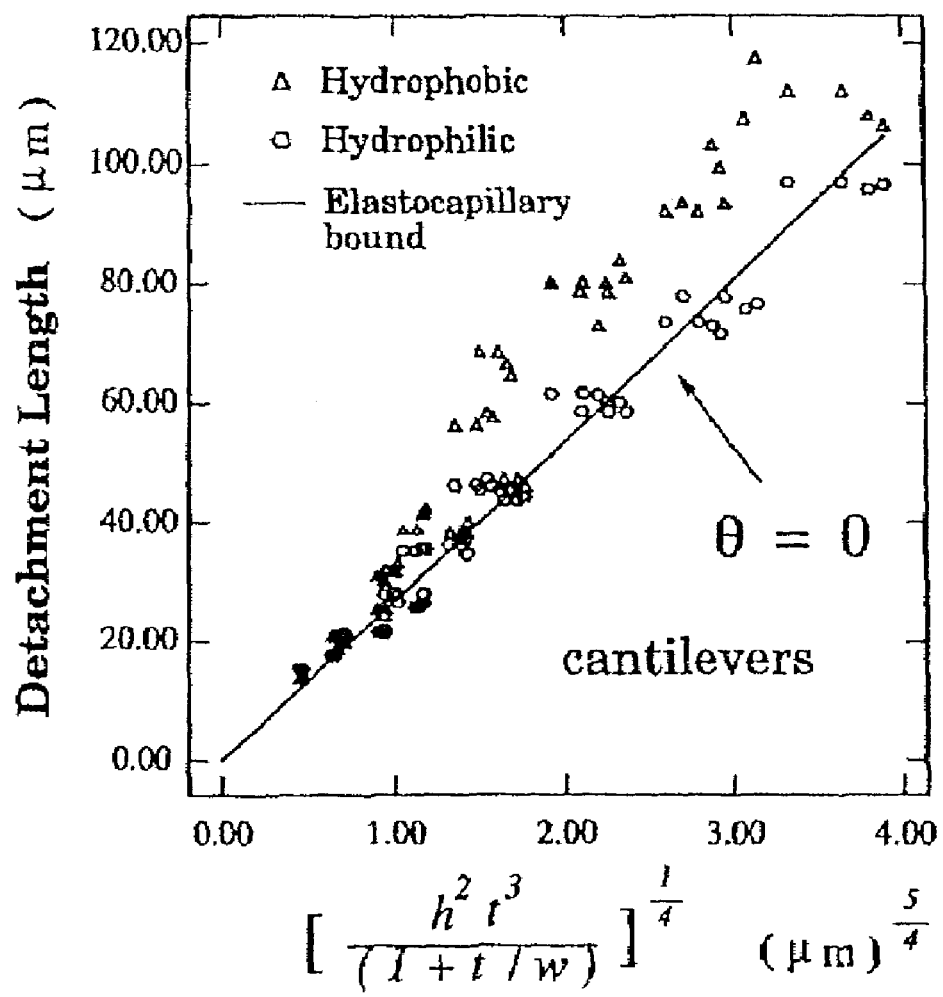
FIG. 6 shows the linear relationship between the detachment length, $L_d$, and the design characteristics, $[h2t3/(1+t/w)]1/4$, of hydrophobic and hydrophilic cantilevers (Reprint of C. H. Mastrangelo's)
Figure 7:
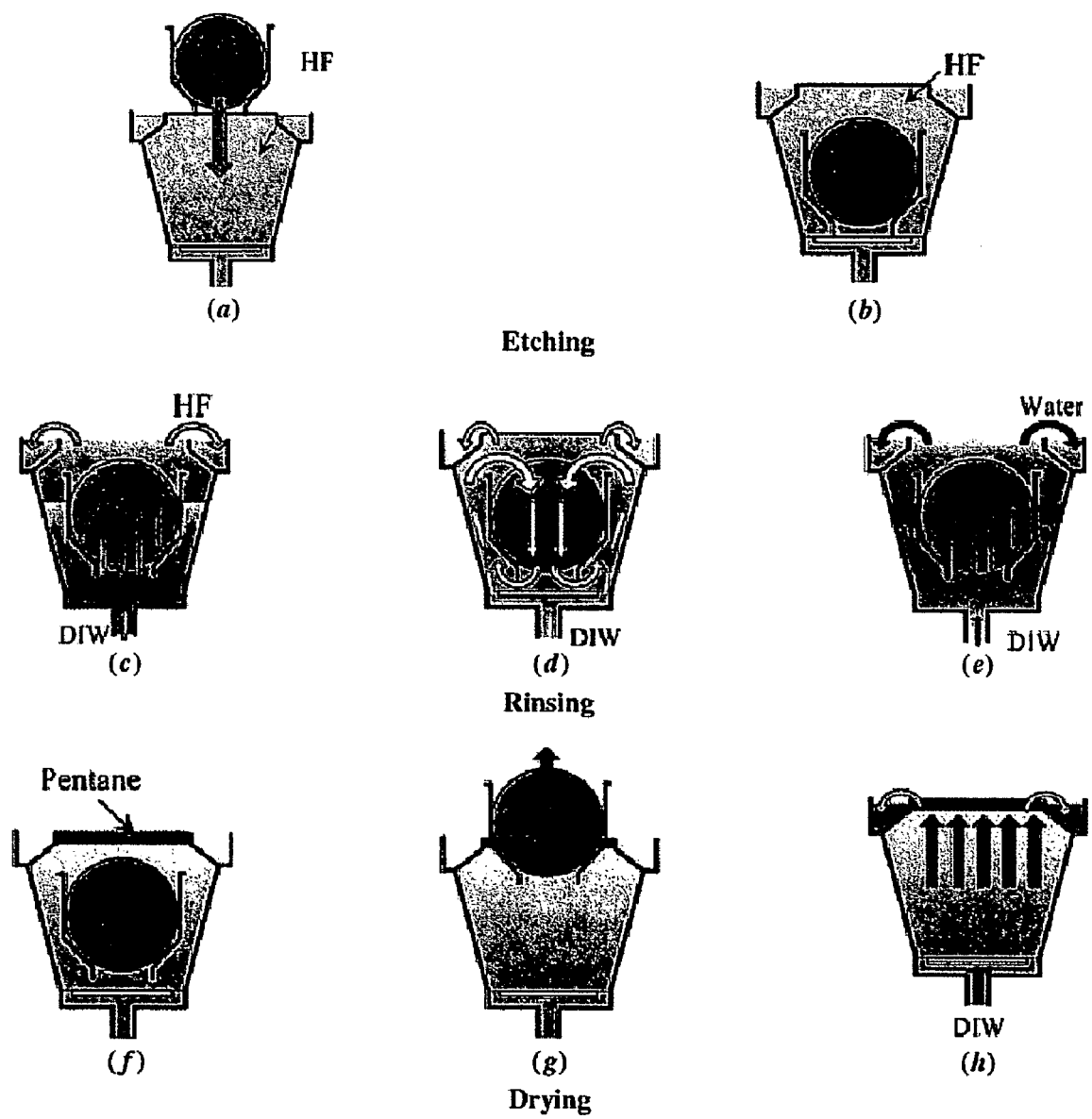
FIG. 7 shows the set-up used by O. Raccurt to ensure a rapid replacement of the non-buffered 49 wt % HF solution by de-ionized water and then the replacement of this de-ionized water by either: de-ionized water; isopropyl alcohol or pentane.
Figure 9:
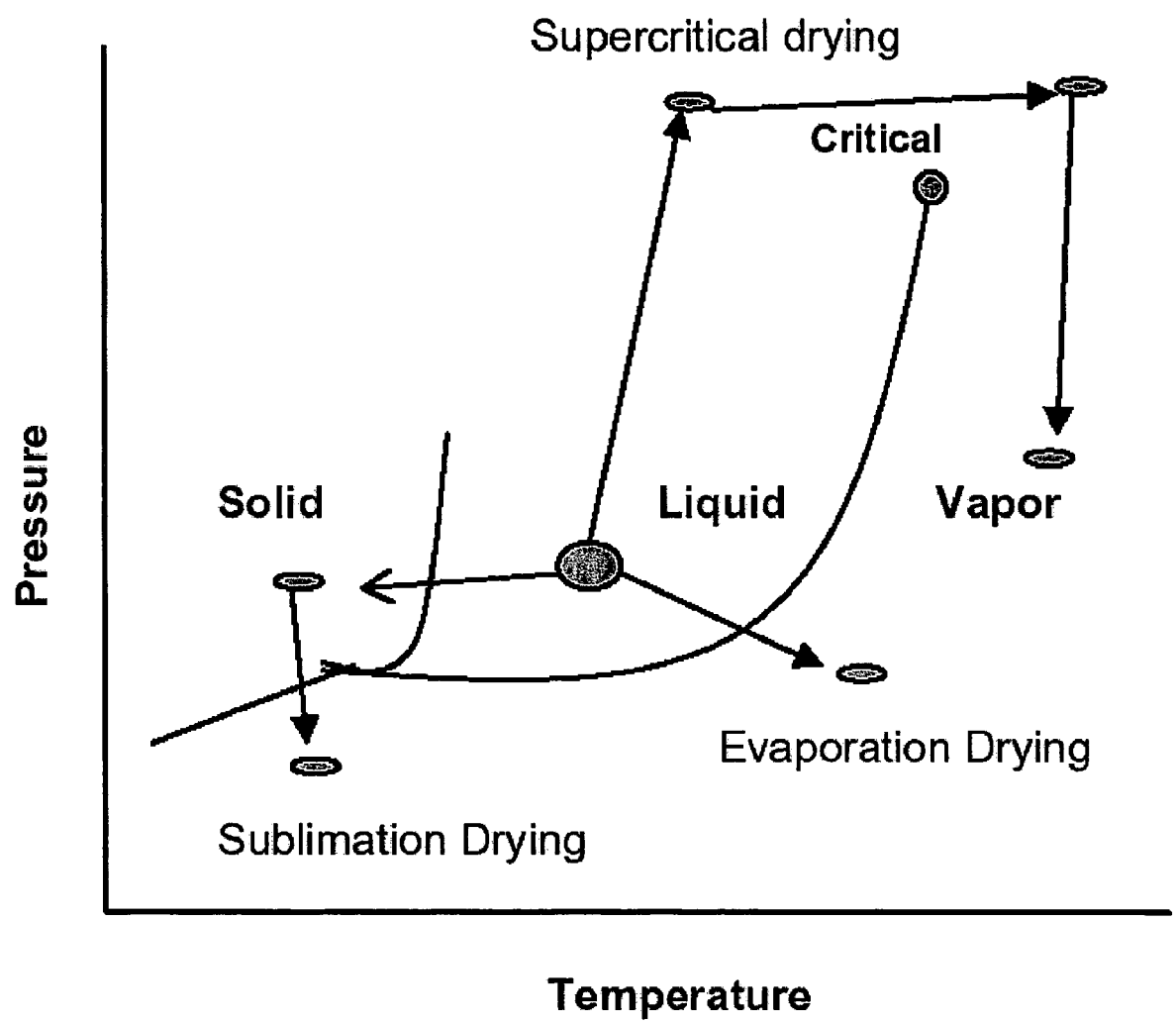
FIG. 9 shows the super-critical $CO_2$ drying mechanism.
Figure 10:
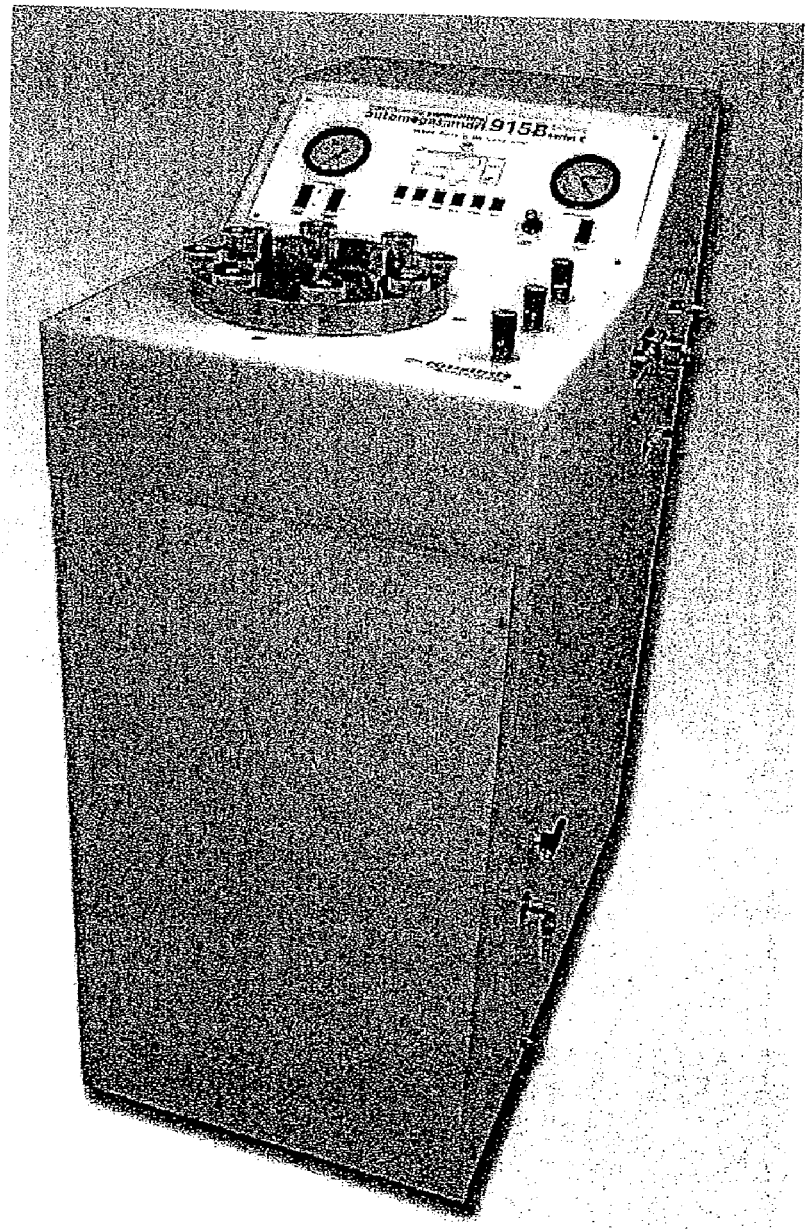
FIG. 10 shows the "Automegasamdri®-915B-Series C" from Tousamis.
Figure 11:
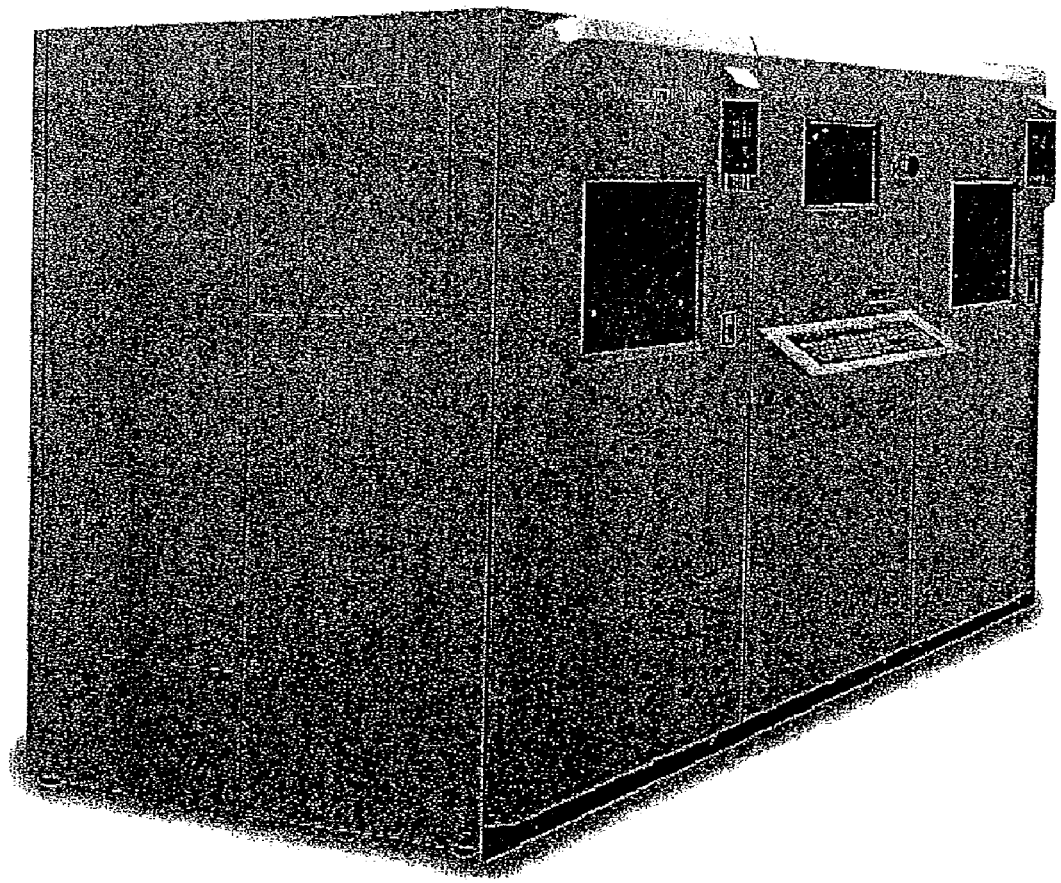
FIG. 11 shows the Excalibur® 2000 Vapor HF Etching System from FSI International.
Figure 13:
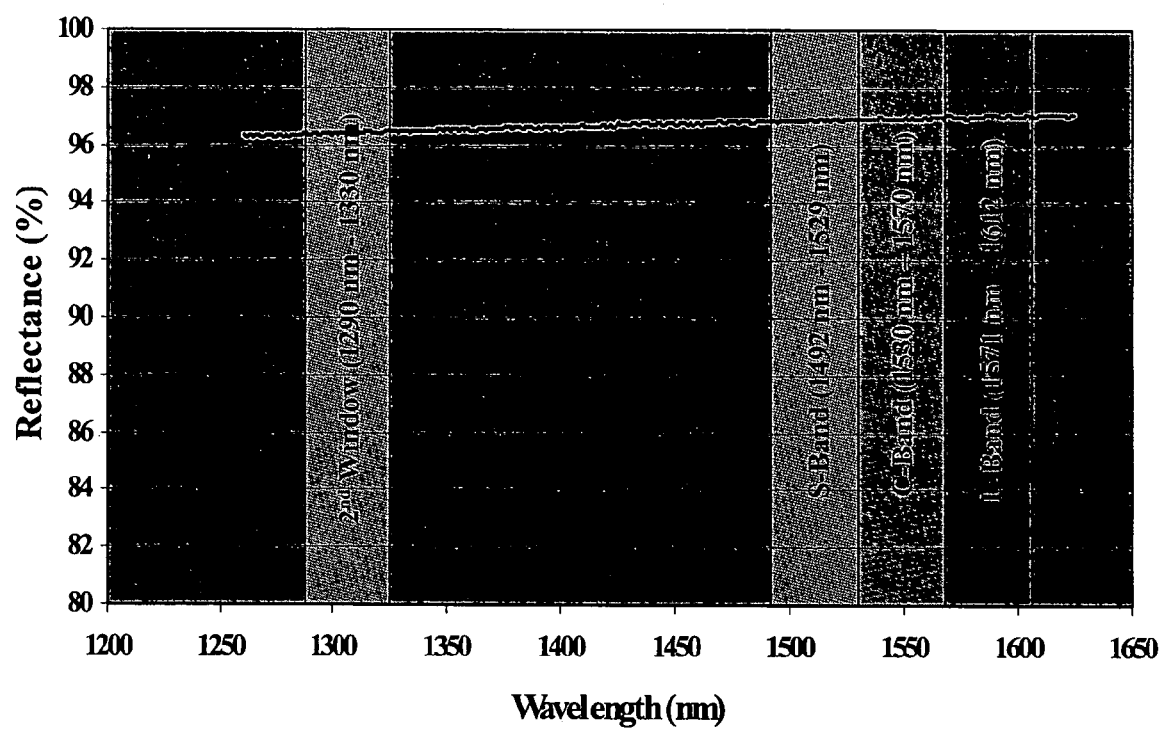
FIG. 13 shows the excellent infrared reflectance of a 0.075 μm thick top coating of aluminum alloy which obviously remained intact following the removal of 100 μm of sacrificial oxide under the 2.5 μm thick silicon structural layer using an extended anhydrous HF exposure.

The inventors have clearly demonstrated the CMOS metal compatibility of the anhydrous HF & solvent (or alcohol) additive process of the above mentioned U.S. Pat. No. 5,439,553 by releasing 800 μm diameter photonics mirrors composed of a 2.5 μm thick doped silicon structure directly coated with a very thin layer (75 nm) of an Al/1.0 wt % Si/0.5 wt % Cu infrared mirror (as per our granted U.S. Pat. No. 6,656,528) and perforated with an array of release holes spaced about 50 μm apart (thus ensuring complete mirror release when laterally removing 100 μm of the underlying 1.0 μm thick sacrificial oxide). Following an extended exposure to this anhydrous HF & solvent (or alcohol) additive process which allowed the removal of 100 μm of sacrificial oxide, the 75 nm thick top coating of aluminum alloy remained untouched and perfectly intact and allowed the excellent infrared reflectance disclosed in FIG. 13.

Figure 14:
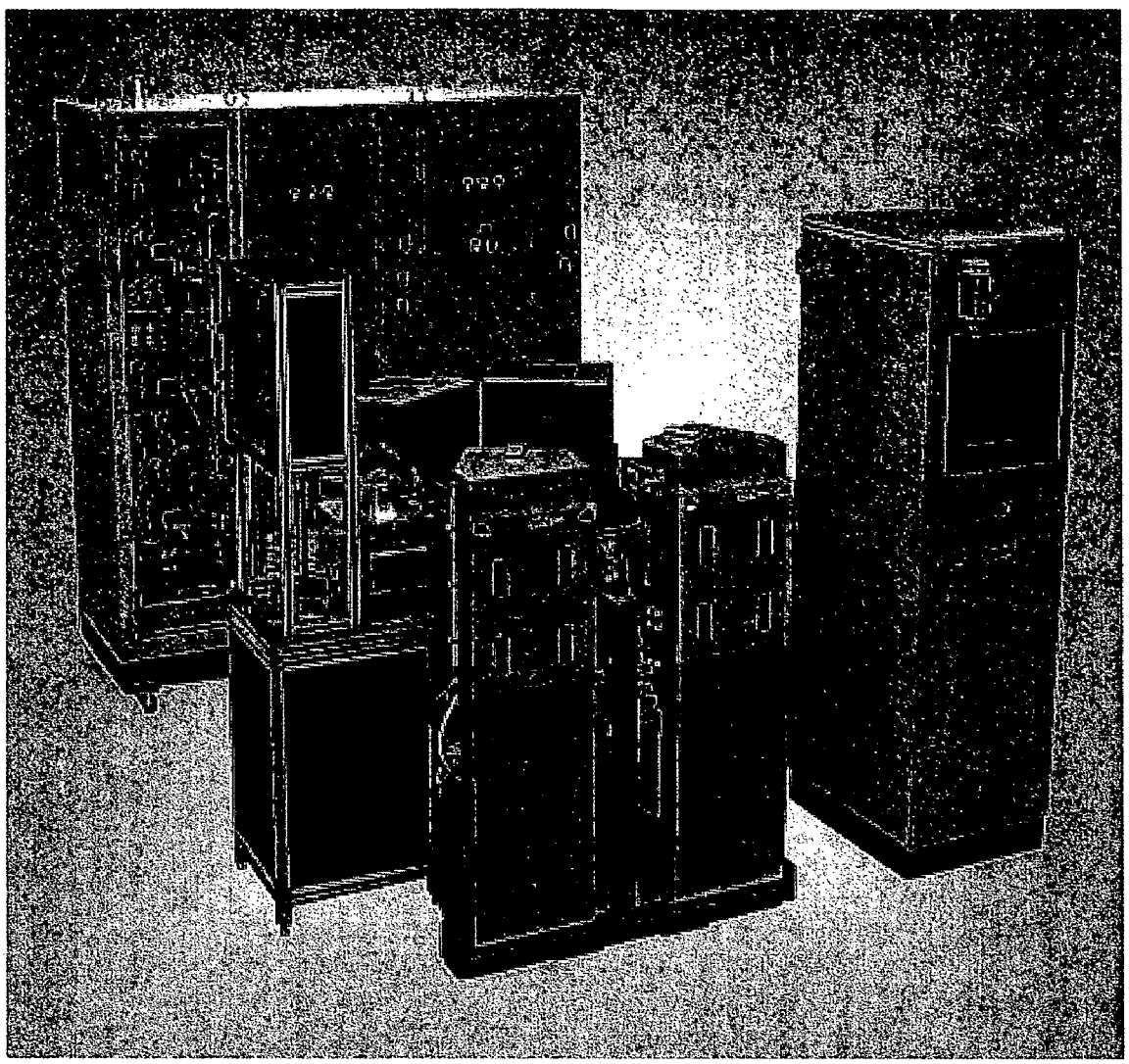
FIG. 14 illustrates the system used to perform anhydrous HF & solvent (or alcohol) additive release process of sensitive mechanical microstructures without any stiction and with full compatibility to standard CMOS metal interconnects.

FIG. 14 shows the type of system used to perform this anhydrous HF & solvent (or alcohol) additive release process of sensitive mechanical microstructures without any stiction and with full compatibility to standard CMOS metal interconnects.

The above chemical reaction involving anhydrous HF and the sacrificial oxide layer to be removed tends to indicate that this anhydrous HF & solvent (or alcohol) additive release process might be ideal for the mechanical release of advanced MEMS devices integrating sensitive mechanical parts prone to stiction as well as digital and/or analog CMOS control logic and/or high voltage CMOS drivers capable of performing actuation functions.

Unfortunately, the silicon nitride dielectric layer which is typically used as an etch-stop layer underneath the oxide to be removed as to limit the penetration of the anhydrous HF and as to prevent the attack of other oxide layers underneath this silicon nitride etch-stop layer does not resist very well when exposed to this anhydrous HF & solvent (or alcohol) additive release process since the exposure of this silicon nitride to anhydrous HF results in an undesirable chemical attack:

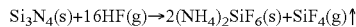

Figure 15:
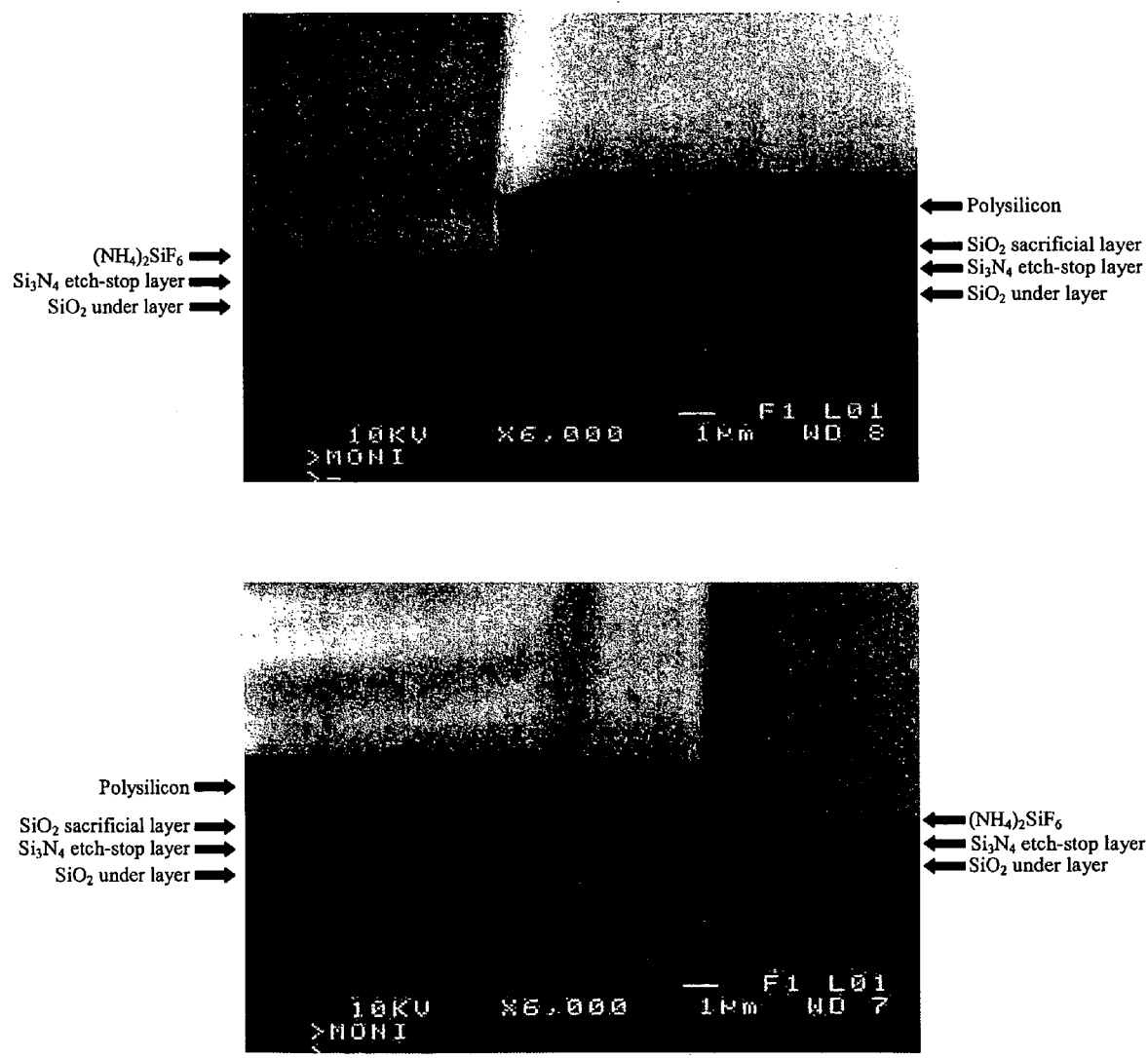
FIG. 15 shows ammonium fluorosilicate, $(NH_4)_2SiF_6$, as result of the attack of the silicon nitride etch-stop layer by anhydrous HF.
Figure 16:
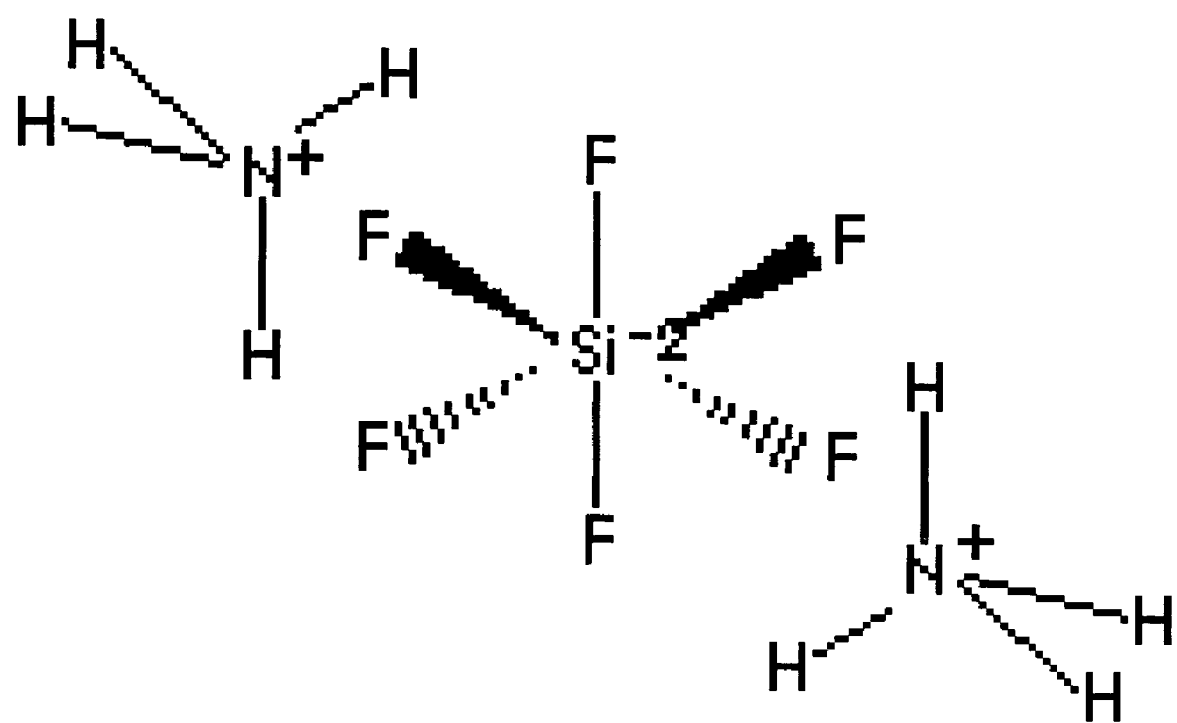
FIG. 16 shows the ammonium fluorosilicate, $(NH_4)_2SiF_6$, toxic material (CAS No.16919-19-0) formed from the HF attack of silicon nitride.

FIG. 15 shows the result of this chemical attack of the anhydrous HF on the silicon nitride etch-stop layer. The chemical compound resulting from this chemical attack, ammonium fluorosilicate, $(NH_4)_2SiF_6$, shown in FIG. 16, forms toxic crystals (CAS No. 16919-19-0):

"MSDS of Ammonium Fluorosilicate", LCI, Ltd., P.O. Box 49000, Jacksonville Beach, Fla. 32240-9000, http://www.lciltd.com/msds %5Cmsdsasf.htm or http://www.flouridealert.com/pesticides/ammonium.fluosilicate.msds.htm;

Ammonium fluorosilicate is also known as: ammonium fluosilicate, ammonium hexafluorosilicate, ammonium silicofluoride, bararite, cryptohalite, cryptophthalite, and diammonium hexafluorosilicate crystals. These toxic ammonium fluorosilicate crystals have two crystalline phases: a cubic α phase with a 2.011 g/cm³ density and a trigonal β phase with a 2.152 g/cm³ density. Since both crystalline phases are highly soluble in water (solubility of 250 grams/liter in water @ 20° C.) or alcohol, they could be removed by a water or alcohol rinse but such a liquid exposure would result in stiction. Another elimination technique than a water rinse should be found to remove them without induced stiction. It is known that ammonium fluorosilicate crystals are thermally unstable and experience a thermal decomposition at a temperature of more than 100° C.:

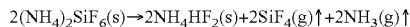

Figure 17:
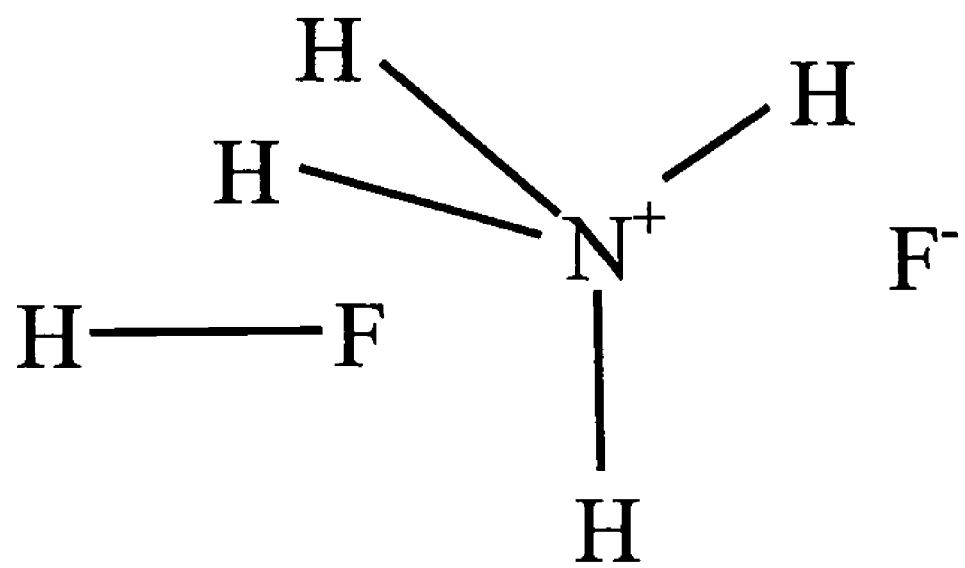
FIG. 17 shows the ammonium bifluoride, $NH_4HF_2$, toxic material (CAS No. 1341-49-7) formed from the thermal decomposition of ammonium fluorosilicate, $(NH_4)_2SiF_6$, the toxic material (CAS No. 16919-19-0) formed from the HF attack of silicon nitride.

The chemical compound resulting from this thermal decomposition, ammonium bifluoride, $NH_4HF_2$, shown in FIG. 17, forms other toxic crystals (CAS No. 1341-49-7). Ammonium bifluoride is under serious control as chemical weapon precursor:

R. J. Mathews, "A Comparison of the Australia Group List of Chemical Weapon Precursors and the CWC Schedules of Chemicals", Chemical Weapons Convention Bulletin, Quarterly Journal of the Harvard Sussex Program on CBW Armament and Arms Limitation, Issue No. 21, September 1993, pp. 1-3;

"Handbook for Notification of Exports to Irak", SC Resolution (1051), Annex C, http://www.casi.org.uk/info/1051list/annexc.html U.N. Resolution 1409, Adopted by the U.N. Security Council, May 2002, "Revised Annex II to the Special Commission's Plan", http://www.iraqwatch.org/controlled/revised-annex2.htm These toxic ammonium bifluoride crystals are also known as: acid ammonium fluoride, ammonium acid fluoride, ammoniumbifluoride, ammonium difluoride, ammonium fluoride, ammonium hydrofluoride, ammonium hydrogen bifluoride, ammonium hydrogen difluoride, ammonium hydrogen fluoride, ammonium monohydrogen difluoride, and flammon crystals. Since these toxic ammonium fluorosilicate crystals are soluble in water or alcohol, they could be removed by a water or alcohol rinse but such a liquid exposure would result in stiction. Another elimination technique than a water rinse should be found to remove them without induced stiction. The following document shows that ammonium bifluoride has a melting point of 124.6° C. and a boiling point of 240° C. at atmospheric pressure:

"MSDS of Ammonium Bifluoride", Ampex Chemicals, S.A. de C.V., http://www.analytvka.com.mx/tabla%20periodica/MSDS/N/AMMONIUM%20BIFLUORIDE.htm;

The elimination of the toxic ammonium bifluoride crystals at a temperature exceeding 240° C. at atmospheric pressure is potentially an excellent technique that could ensure proper elimination of these crystals without the use of any liquids and any stiction issues.

FIG. 18 shows the top view optical pictures of a MEMS device released by removing the sacrificial oxide using the upper-mentioned anhydrous HF & solvent (or alcohol) additive release process. The top picture is showing a region located over the etch-stop silicon nitride following exposure to the anhydrous HF & solvent (or alcohol) additive release process while the bottom picture also shows a region of the same device also located over the etch-stop silicon nitride following exposure to the anhydrous HF & solvent (or alcohol) additive release process and following an exposure to an oven under a nitrogen ambient at a temperature of more than 240° C. at atmospheric pressure. These optical photographs clearly show how efficient can be the evaporation of the ammonium fluorosilicate crystals using this ex-situ evaporation in a nitrogen ambient at a temperature of more than 240° C. at atmospheric pressure.

Figure 19:
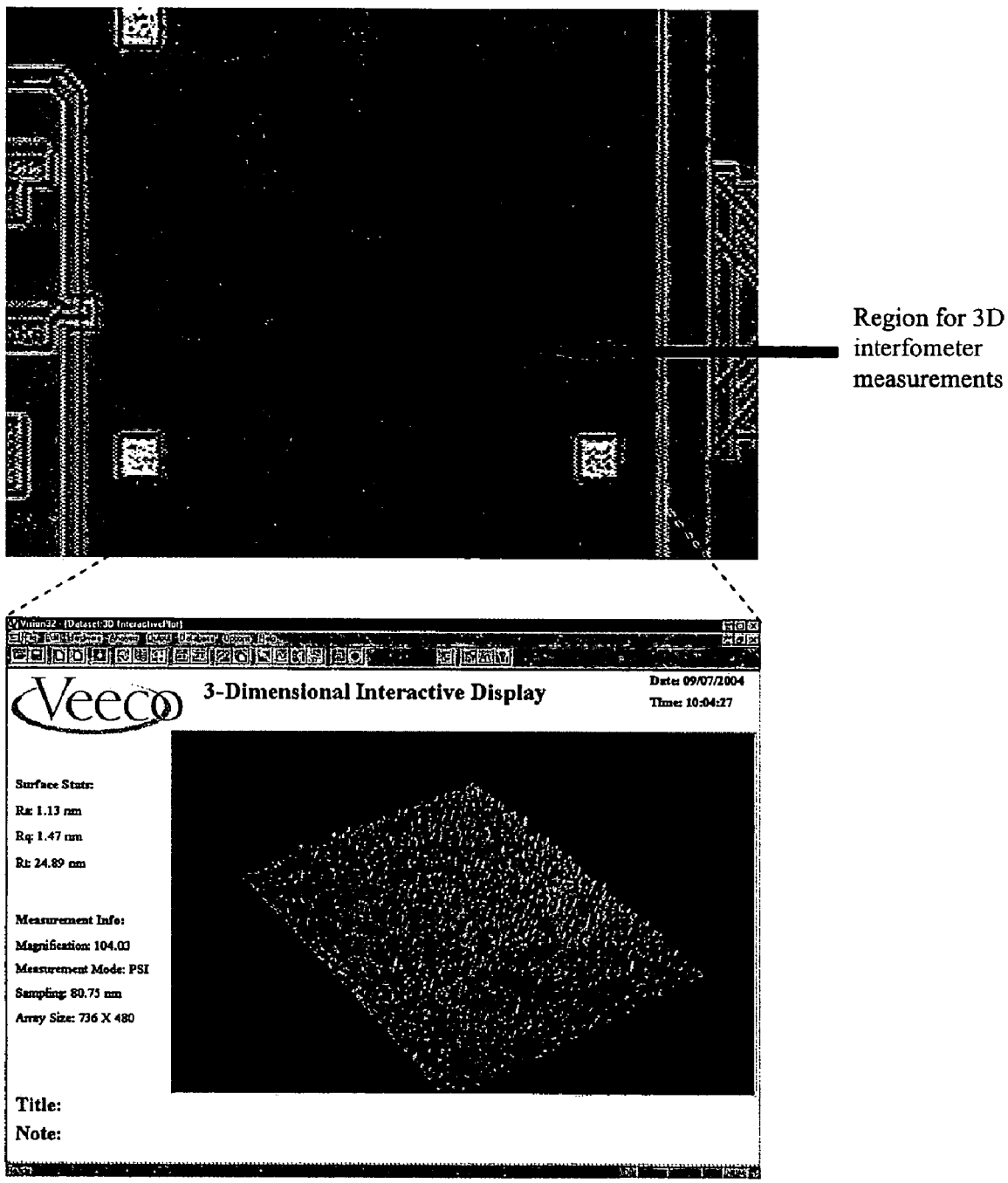
FIG. 19 shows a top view optical picture and white light 3D interferometry nanoimaging of the region of the silicon nitride of a MEMS device which had its mechanical structure released by a anhydrous HF process following the evaporation of the ammonium fluorosilicate crystals. The very smooth surface shows a residual RMS (Rq) surface roughness of only 1.47 nm.

FIG. 19 is a top view optical picture of the region of the silicon nitride of a MEMS device which had its mechanical structure released by removing the sacrificial oxide using the upper-mentioned patented anhydrous HF & solvent (or alcohol) additive release process and which had the ammonium fluorosilicate crystals evaporated using an ex-situ evaporation in an oven under a nitrogen ambient at a temperature of more than 240° C. at atmospheric pressure. The top view optical picture points the region of silicon nitride that has been attacked by the upper-mentioned patented anhydrous HF & solvent (or alcohol) additive release process and that has been cleared from its formed ammonium fluorosilicate crystals following the ex-situ evaporation in an oven under a nitrogen ambient at a temperature of more than 240° C. at atmospheric pressure. The residual surface roughness of this same region is analyzed using white light 3D interferometry nanoimaging as to provide information about the residual topography following the evaporation of these toxic ammonium fluorosilicate crystals, $(NH_4)_2SiF_6$. The white light 3D interferometry nanoimaging clearly shows a very impressive smooth surface with a residual RMS (Rq) surface roughness of only 1.47 nm or about 7 atomic layers. The ex-situ evaporation into an ex-situ oven operated at a temperature of more than 240° C. under nitrogen ambient at atmospheric pressure is then very effective in the elimination of these residual ammonium fluorosilicate crystals from the surface. This evaporation technique has also been reported in the following document:

B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620)

Unfortunately, the use of an ex-situ evaporation into an ex-situ oven operated at a temperature of more than 240° C. under a nitrogen ambient at atmospheric pressure is a very serious hazard which causes very serious health and safety concerns since the ex-situ thermal decomposition of the toxic ammonium fluorosilicate crystals, $(NH_4)_2SiF_6(s)$, into toxic ammonium bifluoride crystals, $NH_4HF_2(s)$, sublimating as a toxic ammonium bifluoride vapor, $NH_4HF_2(g)$, implies a direct exposure of operators to this toxic ammonium bifluoride vapor when they un-load the evaporated wafers from the oven:

$$2(NH_4)_2SiF_6(s) \rightarrow 2NH_4HF_2(s) + 2SiF_4(g)\uparrow + 2NH_3(g)\uparrow$$

$$2NH_4HF_2(s) \rightarrow 2NH_4HF_2(g)\uparrow$$

Moreover, the use of an ex-situ evaporation into an ex-situ oven in a typical production environment systematically results in a direct exposure of ammonium fluorosilicate to moisten ambient atmosphere (a modern semiconductor fabrication facility is typically maintained at a fixed 40% relative humidity as to protect against electro-static discharges, ESD) and in an uncontrolled delay between the first moments of direct exposure of ammonium fluorosilicate to moisten ambient atmosphere and the ex-situ evaporation of ammonium fluorosilicate into the oven operated under a nitrogen ambient at atmospheric pressure. It is known from the glass frosting industry that ammonium fluorosilicate to crystals, $(NH_4)_2SiF_6(s)$, are deliquescent salts which are so hygroscopic that they readily attract moisture from this direct exposure to moisten ambient atmosphere and readily form liquid solutions:

http://www.torlincn.com/Ammonium%20Bifluoride
http://ktv-ok.com/ffnew/edoc5.htm
http://www.hyperdictionary.com/dictionary/deliquescent It has recently been observed that deliquescence of thin film salts is a nucleation phenomenon:

http://www.phy.mtu.edu/colloquiums/cantrell2.html
Cantrell, W., C. McCrory, G. Ewing, "Nucleated deliquescence of salt", *J. Chem. Phys.*, 116, 2116-2120, 2002

This implies that the expected very uniform film of ammonium fluorosilicate resulting from the exposure of a uniform film of silicon nitride to the upper-mentioned patented anhydrous HF & solvent (or alcohol) additive release process will gradually result in the transformation of this expected uniform film of ammonium fluorosilicate into a surface covered by series of isolated droplets of ammonium fluorosilicate solution following a direct exposure to moisten ambient atmosphere. If this exposure is prolonged some of these isolated liquid droplets may coalesce and form larger liquid droplets, thus resulting in a random size distribution of liquid droplets. These liquid droplets are indeed chemically active liquid solutions that may result in modifications of their chemical content. As previously discussed in the upper section 2.1 "Stiction issues with liquid buffered HF and non-buffered HF solutions", the following physical and chemical reactions result from the exposure of ammonium fluorosilicate to the adsorbed and absorbed water vapor in the non-uniform liquefied droplets:

$$2(NH_4)_2SiF_6(s) \text{ in moist ambient} \rightarrow 2(NH_4)_2SiF_6 \text{ (droplet)}$$

$$2(NH_4)_2SiF_6(\text{droplet}) \leftrightharpoons 4NH_4^+(\text{droplet}) + 4OH^-(\text{droplet}) + 2SiF_6^{-2}(\text{droplet}) + 4H^+(\text{droplet})$$

The resulting random size distribution of liquid droplets will be transformed into a random size distribution of crystals when the surface covered by these liquid droplets will be investigated using a Scanning Electron Microscope, SEM, operating under vacuum. This phase transformation is provoked by the vacuum evaporation of water from the liquid droplets and results in the formation of a random size distribution of isolated crystals. The chemical composition of the individual crystals depends upon the chemical reactions that have occurred in the isolated liquid droplets in direct contact with the moisten atmosphere prior to water evaporation and SEM investigation.

The hygroscopic nature of the expected uniform surface of ammonium fluorosilicate, the deliquescent nature of the ammonium fluorosilicate surface provoking the liquefaction of this expected uniform surface into a uniform distribution of liquid droplets, the coalescence of this uniform distribution of liquid droplets into a random distribution of droplets that can achieve larger heights than the deposited thickness of silicon nitride and the crystallisation of this random distribution of droplets into a random distribution of isolated crystals of various chemical compositions that result from the exposure of silicon nitride to the upper-mentioned patented anhydrous HF & solvent (or alcohol) additive release process followed by exposure to moisten atmosphere prior to an ex-situ evaporation in an oven under a nitrogen ambient at a temperature of more than 240° C. at atmospheric pressure is here below demonstrated using two vacuum investigation techniques: 1) Electron X-Ray Diffraction, EDX, investigation & 2) Secondary Electron Microscopy, SEM, investigation.

Figure 20:
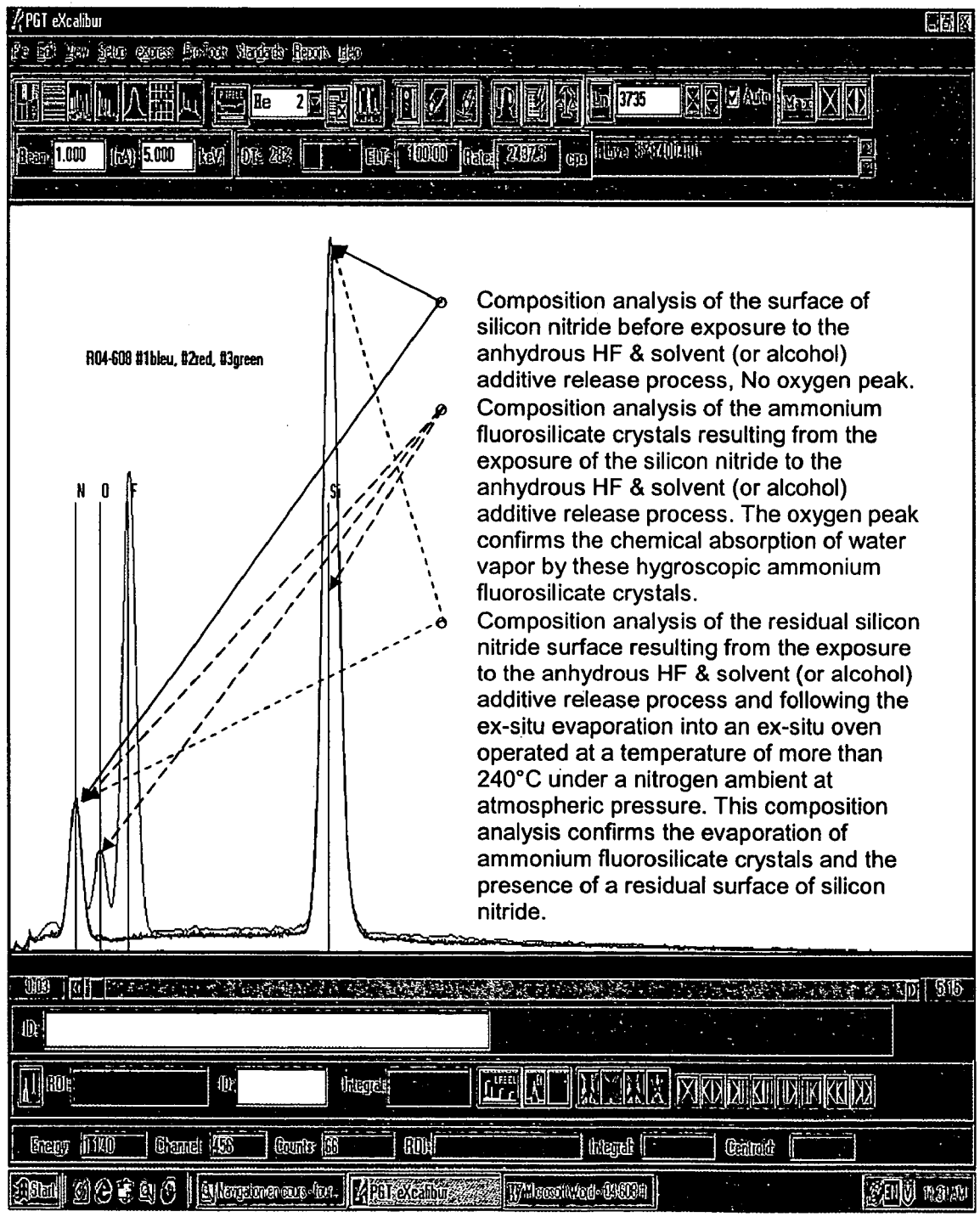
FIG. 20 shows the chemical analysis confirming the chemical absorption of water vapor by the hygroscopic ammonium fluorosilicate crystals in the region of the silicon nitride of a MEMS device which had its mechanical structure released.
Figure 21:
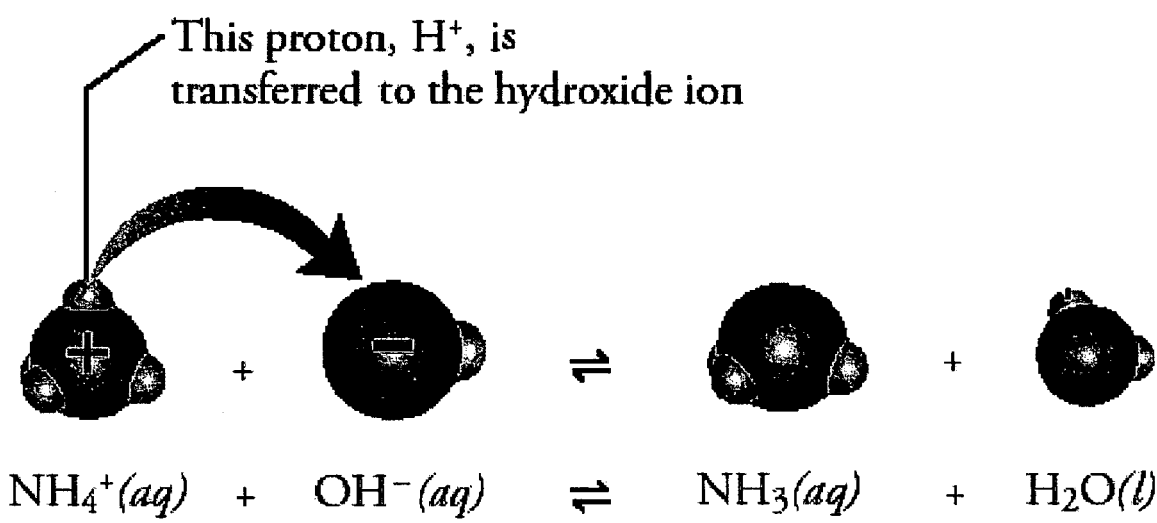
FIG. 21 illustrates how ammonium cations in water solutions are very unstable and readily convert to ammonia by a proton exchange from the ammonium cation to the hydroxyl anion.

The Electron X-Ray Diffraction investigation of FIG. 20 compares the composition analysis performed in the region of the silicon nitride of a MEMS device that had its mechanical structure released. This FIG. 20 shows three compositions profiles that show the composition analysis of:

The surface of silicon nitride before exposure to the anhydrous HF & solvent (or alcohol) additive release process. The absence of an oxygen peak confirms a good quality silicon nitride surface prior to the exposure of silicon nitride to the upper-mentioned patented anhydrous HF & solvent (or alcohol) additive release process;

The silicon nitride surface covered by ammonium fluorosilicate crystals resulting from the exposure of the silicon nitride to the anhydrous HF & solvent (or alcohol) additive release process. The oxygen peak confirms the predicted chemical absorption of water vapor by these hygroscopic ammonium fluorosilicate crystals;

The residual silicon nitride surface resulting from the exposure of the silicon nitride to the anhydrous HF & solvent (or alcohol) additive release process and following the ex-situ evaporation into an ex-situ oven operated at a temperature of more than 240° C. under a nitrogen ambient at atmospheric pressure. This composition analysis confirms the evaporation of ammonium fluorosilicate crystals from the residual silicon nitride.

It is then clear that the ex-situ evaporation of ammonium fluorosilicate crystals into an ex-situ oven operated at a temperature of more than 240° C. under a nitrogen ambient at atmospheric pressure in a typical production environment implying a direct exposure to moisten ambient atmosphere and an uncontrolled delay between the first moments of this direct exposure to moisten ambient atmosphere and the ex-situ evaporation of ammonium fluorosilicate crystals into an ex-situ oven operated at a temperature of more than 240° C. under a nitrogen ambient at atmospheric pressure result in hydrated ammonium fluorosilicate crystals from the adsorbed and absorbed water vapor from the moist ambient atmosphere.

The deliquescence nature of ammonium fluorosilicate results in an initial uniform size distribution of liquefied ammonium fluorosilicate droplets that gradually becomes a random size distribution of coalesced ammonium fluorosilicate droplets with the individual droplet dimensions and water content being dictated by water water surface tension effects:

$$2(NH_4)_2SiF_6(s) \text{ in moist ambient} \rightarrow 2(NH_4)_2SiF_6(droplet)$$

$$2(NH_4)_2SiF_6(droplet) \leftrightharpoons 4NH_4^+(droplet)+4OH^-(droplet)+2SiF_6^{-2}(droplet)+4H^+(droplet)$$

This surface tension induced differenciation in the water content of the individual liquid droplets is a first step in the chemical differentiation of the individual ammonium fluorosilicate solution droplets.

It is well known that ammonium cations in water solutions are very unstable and readily convert to ammonia by a proton exchange from the ammonium cation to the hydroxyl anion formed from the condensing water vapor:

$$2NH_4^+(\text{droplet})+2OH^-(\text{droplet}) \leftrightarrows 2NH_3(\text{droplet})+2H_2O(\text{droplet})$$

This mechanism is shown in FIG. 21. Because ammonia is a gas at atmospheric pressure and temperature, some of the formed ammonia in the individual liquid droplets, $NH_3$ (droplet), do evaporate. This partial and irreversible ammonia evaporation results in the partial and irreversible elimination of ammonium ions from the individual liquid droplets:

$$2NH_4^+(\text{droplet})+2OH^-(\text{droplet}) \leftrightarrows 2NH_3(\text{droplet})+2H_2O(\text{droplet}) \rightarrow NH_3(g)\uparrow+NH_3(\text{droplet})+2H_2O(\text{droplet})$$

The resulting irreversible decrease of pH of the individual liquefied droplet of various dimensions and water content which experience the irreversible elimination of more or less of their ammonium cations by irreversible evaporation of ammonia, $NH_3(g)\uparrow$, is a second step toward the chemical differenciation of these individual droplets (the island solution becomes more acidic):

$$2(NH_4)_2SiF_6(\text{droplet}) \rightarrow 2NH_3(g)\uparrow+2NH_4^+(\text{droplet})+2OH^-(\text{droplet})+2H_2O(\text{droplet})+2SiF_6^{-2}(\text{droplet})+4H^+(\text{droplet})$$

A similar proton exchange mechanism than the one shown in FIG. 21 is also possible with the free protons and the $SiF^{6-2}$ anions of the acidic droplets, thus causing the formation of silicon tetrafluoride in the individual droplet having an individual pH level dictating the proton chemical activity:

$$2SiF_6^{-2}(\text{droplet})+4H^+(\text{droplet}) \rightarrow 2SiF_4(\text{droplet})+4HF(\text{droplet})$$

Because the resulting silicon tetrafluoride in the liquified droplet, $SiF_4$(droplet), is also a gas at atmospheric pressure and temperature, some of the formed silicon tetrafluoride in the individual liquid droplet, $SiF_4$(droplet), do evaporate. This partial and irreversible silicon tetrafluoride evaporation, $2SiF_4(g)\uparrow$, results in the irreversible elimination of fluorine anions from the individual liquid droplet solutions:

$$2SiF_6^{-2}(\text{droplet})+4H^+(\text{droplet}) \leftrightarrows 2SiF_4(\text{droplet})+4HF(\text{droplet}) \rightarrow SiF_4(g)\uparrow+SiF_4(\text{droplet})+4HF(\text{droplet})$$

The resulting decrease of fluorine of the individual liquefied droplet of various dimensions and water content which experience the elimination of more or less of their fluorine by evaporation of silicon tetrafluoride is a third step toward the chemical differenciation of these individual droplets:

$$2(NH_4)_2SiF_6(\text{droplet}) \rightarrow 2NH_3(g)\uparrow+2NH_4^+(\text{droplet})+2OH^-(\text{droplet})+2H_2O(\text{droplet})+SiF_4(g)\uparrow+SiF_6^{-2}(\text{droplet})+2H^+(\text{droplet})+2HF(\text{droplet})$$

Depending upon relative humidity conditions, exposure duration to moisten ambient atmosphere, ambient temperature and ambient atmospheric pressure, the net and relative proportion of evaporated ammonia, $NH_3(g)\uparrow$, or silicon tetrafluoride, $SiF_4(g)\uparrow$, and the surface tension effect of the individual droplets will dictate the residual pH of the individual droplets by dictating the residual water content, $H_2O$(droplet), as well as the residual proportion of ammonium solution, $2NH_4^+$(droplet)+$2OH^-$(droplet), and the residual proportion of fluorosililic acid solution, $SiF_6^{-2}$(droplet)+$2H^+$(droplet), within the various dimension liquid droplets.

Some of these individual droplets will have a relative chemical composition of ammonium solution, $2NH_4^+$(droplet)+$2OH^-$(droplet), and fluorhydric acid, HF(droplet), which will provoke a fourth and undesirable step: the chemical formation of ammonium bifluoride (also called ammonium hydrogendifluoride) in some of the droplets, $NH_4HF_2$(droplet):

$$NH_4^+(\text{droplet})+OH^-(\text{droplet})+2HF(\text{droplet}) \leftrightarrows NH_4HF_2(\text{droplet})+H_2O(\text{droplet})$$

The resulting undesirable chemical reaction between the ammonium solution, $2NH_4^+$(droplet)+$2OH^-$(droplet), and hydrofluoric acid, HF(droplet), is a fourth undesible step toward the chemical differenciation of these individual droplet and is to be avoided as to ensure a residue-free complete evaporation of these various liquid droplets during the ex-situ evaporation in the ex-situ oven operated at a temperature of more than 240° C. under a nitrogen ambient at atmospheric pressure:

$$2(NH_4)_2SiF_6(\text{droplet}) \rightarrow 2NH_3(g) \rightarrow +NH_4^+(\text{droplet})+OH^-(\text{droplet})+3H_2O(\text{droplet})+SiF_4(g)\uparrow+SiF_6^{-2}(\text{droplet})+2H^+(\text{droplet})+NH_4HF_2(\text{droplet})$$

The ammonium bifluoride now in solution in some specific droplets are indeed deliquesced ammonium bifluoride crystals:

http://www.chemnet.com/show/galtchem/eproduct/00018839.html

A large proportion of the formed droplets could result in the formation of these undesirable deliquesced ammonium bifluoride crystals because ammonium bifluoride has a high solubility of 630 grams/liter in water @ 20° C.

Some of these individual droplets having a pH and a proportion of ammonium bifluoride crystals, $NH_4HF_2$(droplet), prone to ammonium bifluoride decomposition will trig a fifth and undesirable step: the chemical formation of ammonium fluoride, $NH_4F$(droplet):

$$NH_4HF_2(\text{droplet}) \rightarrow NH_4F(\text{droplet})+HF(\text{droplet})$$

The resulting undesirable decomposition of deliquesced ammonium bifluoride crystals, $NH_4HF_2$(droplet), into deliquesced ammonium fluoride crystals, $NH_4F$(droplet), is a fifth undesible step toward the chemical differenciation of these individual droplet and is to be avoided as to ensure a residue-free complete evaporation of these various liquid droplets during the ex-situ evaporation in the ex-situ oven operated at a temperature of more than 240° C. under a nitrogen ambient at atmospheric pressure:

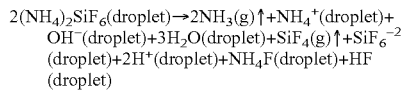

Since ammonium fluoride, $NH_4F$, has a melting point of 993° C. and a boiling point of 1700° C. it is then solid at room temperature. This net transformation of deliquesced ammonium fluorosilicate crystals, $(NH_4)_2SiF_6$ (deliquesced), into deliquesced ammonium bifluoride crystals, $NH_4HF_2$(deliquesced), will result in a random distribution of residual ammonium fluoride crystals, $NH_4F(s)$, on the silicon nitride surface following the ex-situ evaporation in the ex-situ oven operated at a temperature of more than 240° C. under a nitrogen ambient at atmospheric pressure in which:

The residual ammonium solution of the droplets, $NH_4^+$ (droplet)+$OH^-$(droplet), will evaporate as volatile ammonia, $NH_3(g)\uparrow$, and water vapor, $H_2O$(droplet)$\uparrow$;

The residual fluorosililic acid of the droplets, $SiF_6^{-2}$ (droplet)+$2H^+$(droplet), will evaporate as volatile silicon tetrafluoride, $SiF_4(g)\uparrow$, and hydrofluoric acid, $2HF$(droplet)$\uparrow$;

The residual deliquesced ammonium fluoride crystals of the droplets, $NH_4F$(droplet), will leave a random distribution of solid fluoride crystals residues, $NH_4F(s)$, onto the silicon nitride surfaces.

It is clear that the ex-situ evaporation of ammonium fluorosilicate, $(NH_4)_2SiF_6$, into an ex-situ oven operated at a temperature of more than 240° C. under a nitrogen ambient at atmospheric pressure in a typical production environment implying a direct exposure to moisten ambient atmosphere and an uncontrolled delay between the first moments of this direct exposure to moisten ambient atmosphere and the ex-situ evaporation of ammonium fluorosilicate, $(NH_4)_2SiF_6$, into an ex-situ oven operated at a temperature of more than 240° C. under a nitrogen ambient at atmospheric pressure results in a undesirable random distribution of residual ammonium fluoride crystals which presence causes very serious yield problems as an alternate way to achieve operator-safe residue-free release of anhydrous HF to release MEMS micro-devices integrating very sensitive moving mechanical parts, digital and/or analog CMOS control logic and/or high voltage CMOS drivers capable of performing actuation functions:

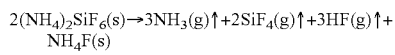

The presence of this random distribution of solid ammonium fluoride crystals residues that CANNOT be evaporated anymore using the ex-situ evaporation of ammonium fluorosilicate crystals into an ex-situ oven operated at a temperature of more than 240° C. under a nitrogen ambient at atmospheric pressure (if the evaporation temperature is maintained lower than ammonium fluoride's, $NH_4F$, boiling point of 1700° C.) is a very serious problem that needs to be eliminated.

The formation of these non-evaporated ammonium fluoride residues has been observed for air-exposed ammonium fluorosilicate crystals that we tried to evaporate using ex-situ evaporation of these ammonium fluorosilicate crystals into an ex-situ oven operated at a temperature of more than 240° C. under nitrogen ambient at atmospheric pressure.

The hygroscopic nature of the expected uniform surface of ammonium fluorosilicate, the deliquescent nature of the ammonium fluorosilicate surface provoking the liquefaction of this expected uniform surface into a uniform series of liquid droplet, the coalescence of this series of uniform liquid droplet into a random distribution of isolated droplets that can achieve larger heights than the deposited thickness of silicon nitride, the subtle chemical reactions resulting in ammonia and silicon tetrafluoride evaporation from some of these formed droplets and the random formation of deliquesced ammonium fluoride within this random distribution of liquid droplets that result from the exposure of silicon nitride to the upper-mentioned patented anhydrous HF & solvent (or alcohol) additive release process to a moisten ambient atmosphere is clearly demonstrated using the Secondary Electron Microscopy investigation of FIG. 22 that shows pictures of the surface of the wafers:

Picture 1: Before exposure to anhydrous HF & solvent (or alcohol) additive process of the upper mentioned U.S. Pat. No. 5,439,553. This shows the very clean surface of silicon nitride;

Picture 2: After exposure to anhydrous HF & solvent (or alcohol) additive process of the upper mentioned U.S. Pat. No. 5,439,553. This very rough surface covered by a random distribution of semi-evaporated droplets following the room temperature exposure to the vacuum required for SEM investigation. Note the quasi-spherical shape and individual size of the observed ammonium fluorosilicate, $(NH_4)_2SiF_6(s)$, ammonium bifluoride, $NH_4HF_2(s)$, or ammonium fluoride, $NH_4F(s)$, residues are indeed quite larger than the initial 0.2 μm thickness of attacked silicon nitride, thus proving the droplet coalescence mechanism;

Picture 3: After exposure to anhydrous HF & solvent (or alcohol) additive process of the upper mentioned U.S. Pat. No. 5,439,553 and ex-situ oven evaporation at a temperature of more than 240° C. under a nitrogen ambient at atmospheric pressure. Note the rough surface covered by a random shape and size distribution of residual ammonium fluorosilicate, $(NH_4)_2SiF_6(s)$, ammonium bifluoride, $NH_4HF_2(s)$, or ammonium fluoride, $NH_4F(s)$, crystals are indeed quite larger than the initial 0.2 μm thickness of attacked silicon nitride, thus proving the droplet coalescence mechanism.

Figure 23:
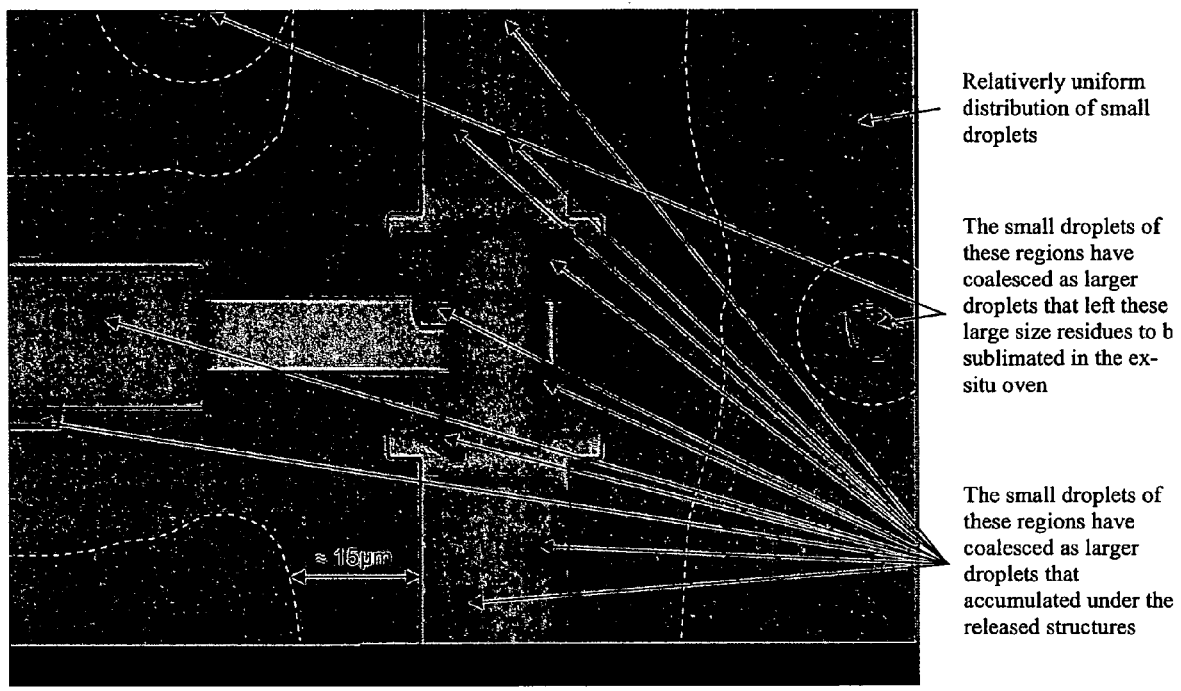
FIG. 23 shows evidence of liquid droplets coalescencing following an anhydrous HF exposure of sacrificial oxide located over a silicon nitride etch-stop underlayer.

FIG. 23 shows another spectacular demonstration of the droplets coalescence mechanism. This optical image of a MEMS device following the removal, using an anhydrous HF process, of the sacrificial oxide layer located over an underlayer of silicon nitride shows:

A field region where a relatively uniform distribution of quasi-spherical shape ammonium fluorosilicate, $(NH_4)_2SiF_6(s)$, ammonium bifluoride, $NH_4HF_2(s)$, or ammonium fluoride, $NH_4F(s)$, droplets residues with a uniform spacing between the individual droplets residues to be sublimated into the ex-situ oven operated at a temperature of more than 240° C. under nitrogen ambient at atmospheric pressure;

Two residue-free circular regions where the individual droplets of the initially uniform distribution of quasi-spherical shape ammonium fluorosilicate, $(NH_4)_2SiF_6(s)$, ammonium bifluoride, $NH_4HF_2(s)$, or ammonium fluoride, $NH_4F(s)$, droplets have coalesced into two large size droplets that left behind two large droplets residues to be sublimated into the ex-situ oven operated at a temperature of more than 240° C. under nitrogen ambient at atmospheric pressure;

A 15-20 μm wide residue-free band along the mechanical structure region of the MEMS device where the individual droplets of the initially uniform distribution of quasi-spherical shape ammonium fluorosilicate, $(NH_4)_2SiF_6(s)$, ammonium bifluoride, $NH_4HF_2(s)$, or ammonium fluoride, $NH_4F(s)$, droplets have coalesced aside and under the release mechanical structures of the MEMS device as a random distribution of large size droplets that left behind a random distribution of large droplets residues to be sublimated into the ex-situ oven operated at a temperature of more than 240° C. under nitrogen ambient at atmospheric pressure.

Unfortunately, this coalescence mechanism results in the formation of residues that are non-sublimable at low temperature, such as ammonium fluoride, $NH_4F(s)$. These residues are undesirable because they can block the mechanisms of the released mechanical parts.

It is clear that the health and safety hazards associated with the operator exposure to the toxic ammonium fluorosilicate crystals, $(NH_4)_2SiF_6(s)$, covering the surface of the wafers following the exposure of the wafers to a anhydrous HF & solvent (or alcohol) additive process of the upper mentioned U.S. Pat. No. 5,439,553 is NOT a desirable technique to safely evaporate these residues because of the presence of hazardous volatile ammonia, silicon tetrafluoride and hydrofluoric acid by-products:

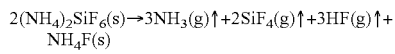
$2(NH_4)_2SiF_6(s) \rightarrow 3NH_3(g)\uparrow + 2SiF_4(g)\uparrow + 3HF(g)\uparrow + NH_4F(s)$ It is also clear that the use of an ex-situ evaporation of ammonium fluorosilicate crystals exposed to a moisten ambient atmosphere prior to an evaporation into an ex-situ oven operated at a temperature of more than 240° C. under a nitrogen ambient at atmospheric pressure results in a random distribution of solid crystals of very important dimensions causing serious mechanical issued is not a desirable technique to reliably release mechanical parts as to achieve stiction-free and residue-free release of MEMS micro-devices integrating very sensitive moving mechanical parts, digital and/or analog CMOS control logic and/or high voltage CMOS drivers capable of performing actuation functions:

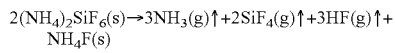
$2(NH_4)_2SiF_6(s) \rightarrow 3NH_3(g)\uparrow + 2SiF_4(g)\uparrow + 3HF(g)\uparrow + NH_4F(s)$ The removal of the solid phase sacrificial oxide layer, $SiO_2(s)$, using a gas phase anhydrous vapor hydrofluoric acid $HF(g)$, produces a clean residue-free elimination of oxide by simple evaporation of gas phase silicon tetrafluoride, $SiF_4(g)\uparrow$, and gas phase water vapor, $H_2O(g)\uparrow$:

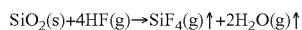
$SiO_2(s) + 4HF(g) \rightarrow SiF_4(g)\uparrow + 2H_2O(g)\uparrow$

Unfortunately, the silicon nitride dielectric layer, $Si_3N_4(s)$, which is typically used as an underlying protective etch-stop layer underneath the oxide to be removed as to limit the penetration of the anhydrous HF and as to prevent the attack of other oxide layers underneath this silicon nitride etch-stop layer does not resist very well when exposed to this anhydrous HF & solvent (or alcohol) additive release process since the exposure of this silicon nitride to anhydrous HF results in an undesirable chemical attack resulting the formation of solid surface of toxic ammonium fluorosilicate, $(NH_4)_2SiF_6(s)$:

$Si_3N_4(s) + 16HF(g) \rightarrow SiF_4(g)\uparrow + 2(NH_4)_2SiF_6(s)$ It is known from the Material Safety Data Sheet of ammonium fluorosilicate, $(NH_4)_2SiF_6(s)$:
"MSDS of Ammonium Fluorosilicate", LCI, Ltd., P.O. Box 49000, Jacksonville Beach, Fla. 32240-9000, http://www.lciltd.com/msds %5Cmsdsasf.htm
http://www.flouridealert.com/pesticides/ammonium.fluosilicate.msds.htm;

that the formed toxic ammonium fluorosilicate, $(NH_4)_2SiF_6(s)$, solid surface is thermally unstable and experiences a thermal decomposition which provoke the evaporation of gas phase silicon tetrafluoride, $SiF_4(g)\uparrow$, and gas phase ammonia, $NH_3(g)\uparrow$, and results in the formation of a residual toxic ammonium bifluoride, $NH_4HF_2(s)$, solid surface at a temperature of more than 100° C.:

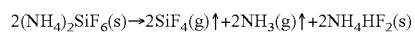
$2(NH_4)_2SiF_6(s) \rightarrow 2SiF_4(g)\uparrow + 2NH_3(g)\uparrow + 2NH_4HF_2(s)$ It is also known from the Material Safety Data Sheet of ammonium bifluoride, $NH_4HF_2(s)$:
"MSDS of Ammonium Bifluoride", Ampex Chemicals, S.A. de C.V., http://www.analytyka.com.mx/tabla%20periodica/MSDS/N/AMMONIUM%20BIFLUORIDE.htm;

that the formed ammonium bifluoride, $NH_4HF_2(s)$, solid surface has a melting point of 124.6° C. and a boiling point of 240° C. at atmospheric pressure. The following publication:
B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620)

gives an estimated phase diagram for ammonium bifluoride, $NH_4HF_2$.

Figure 24:
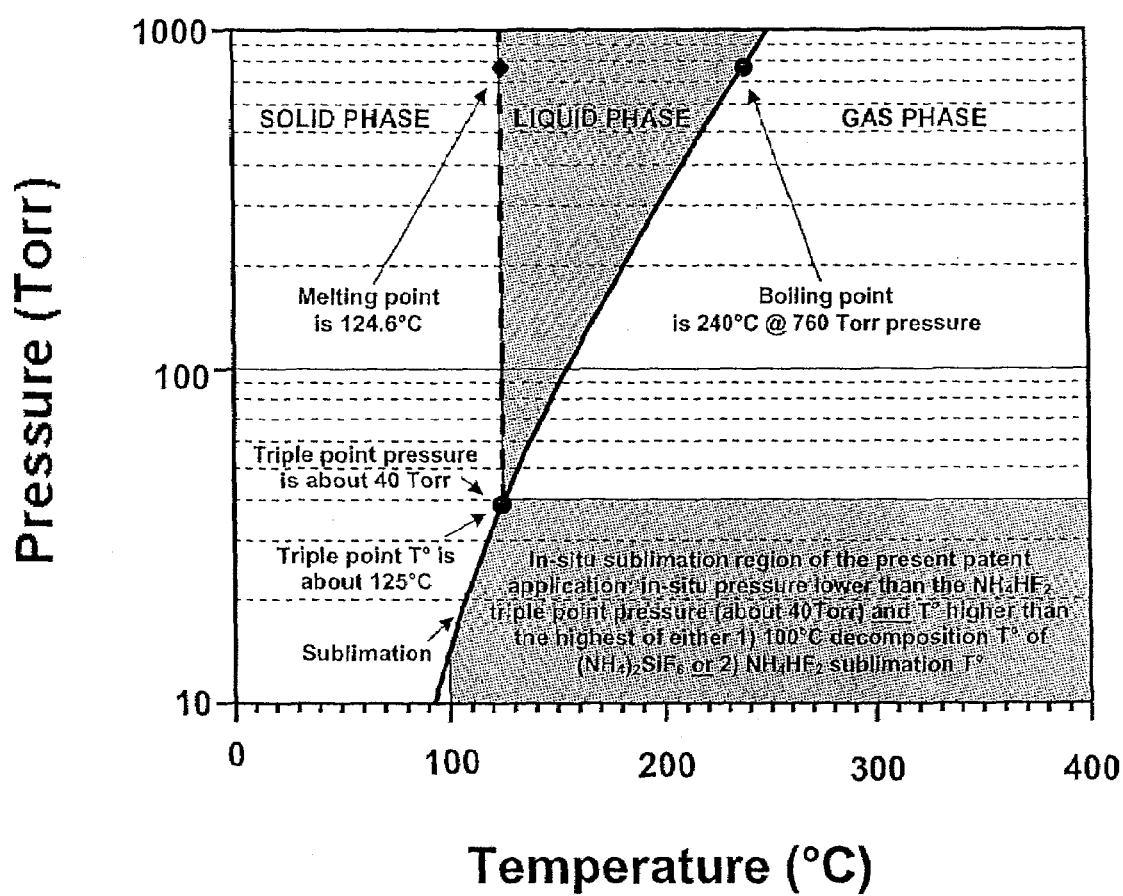
FIG. 24 is a re-sketch of the ammonium bifluoride, $NH_4HF_2(s)$, phase diagram from data proposed by B. Du Bois (IMEC, 1999)

FIG. 24 shows a re-sketch of the ammonium bifluoride, $NH_4HF_2$, phase diagram with an emphasis on the location of the triple point, i.e. the pressure and temperature at which the solid, liquid and gas phases of ammonium bifluoride, $NH_4HF_2$ coexist. This estimated location of the triple point is critically important for the present invention because it predicts which conditions of vacuum and pressure should be used to allow the in-situ sublimation of ammonium bifluoride, without any intermediate liquid phase formation.

FIG. 24 estimates that the complete sublimation of ammonium fluorosilicate, $(NH_4)_2SiF_6(g)\uparrow$, and of ammonium bifluoride, $NH_4HF_2(g)\uparrow$, is possible without any intermediate liquid phase formation at a pressure of less than the ammonium bifluoride triple point pressure of about 40 Torr if the temperature is higher than the ammonium bifluoride sublimation temperature and if the temperature is higher than the ammonium fluorosilicate decomposition temperature T ° of 100° C.:

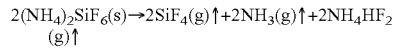
$2(NH_4)_2SiF_6(s) \rightarrow 2SiF_4(g)\uparrow + 2NH_3(g)\uparrow + 2NH_4HF_2(g)\uparrow$ FIG. 24 shows that an anhydrous HF release process operating at a pressure of less than the ammonium bifluoride triple point pressure of about 40 Torr and at the temperature of the highlighted grey zone of FIG. 24 could result in a residue-free removal of the oxide sacrificial layer and in a residue-free attack of the underlying silicon nitride etch-stop layer:

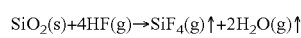
$SiO_2(s) + 4HF(g) \rightarrow SiF_4(g)\uparrow + 2H_2O(g)\uparrow$

Figure 25:
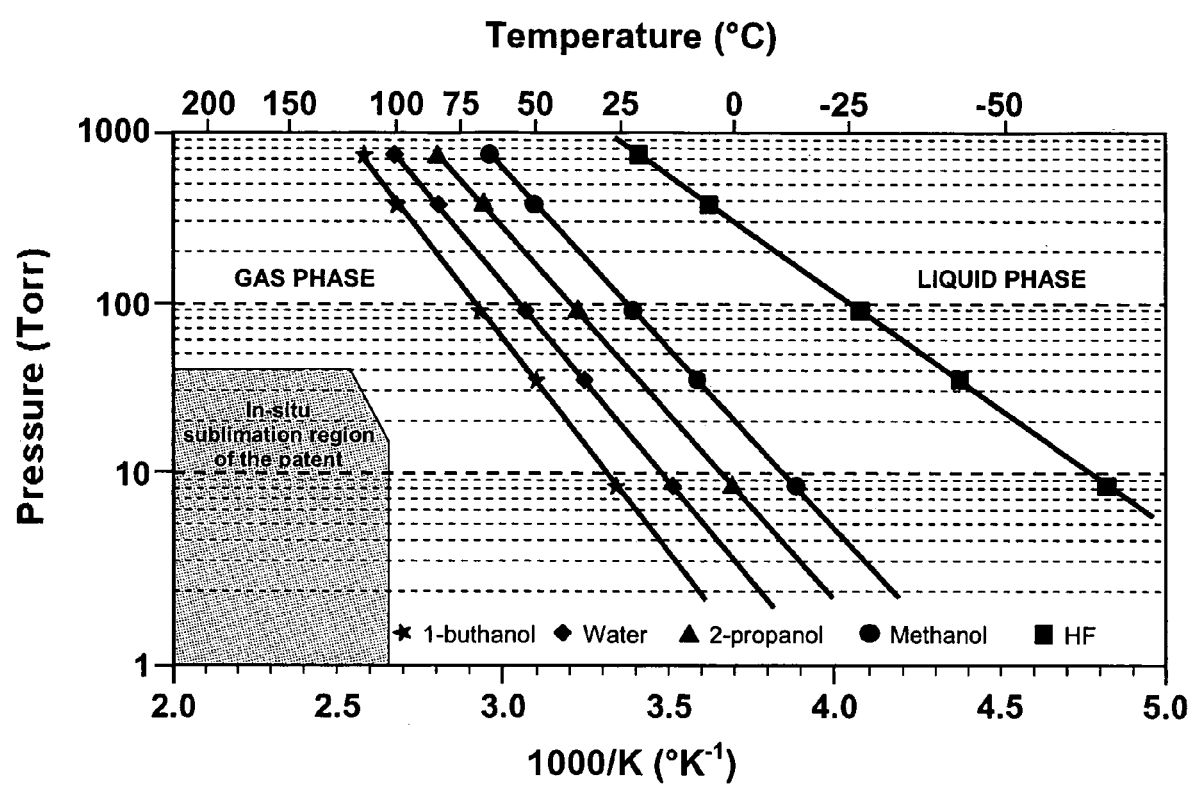
FIG. 25 shows the temperature dependency of HF, water and methanol vapor pressure.

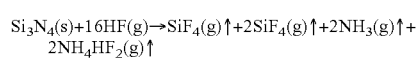
$Si_3N_4(s) + 16HF(g) \rightarrow SiF_4(g)\uparrow + 2SiF_4(g)\uparrow + 2NH_3(g)\uparrow + 2NH_4HF_2(g)\uparrow$ Unfortunately, FIG. 25 shows that the vapor pressure of anhydrous HF increases very rapidly with an increase of temperature from room temperature to the temperature of the highlighted grey zone of FIG. 24 which allows a residue-free release of sacrificial oxide. This increase of vapor pressure on anhydrous HF results in an important reduction of the adsorption rate of HF molecules and reduces the net surface coverage of adsorbed HF molecules onto the surface of the oxide to be removed. Since HF surface coverage onto the sacrificial oxide to be removed is one of the initating steps provoking its removal, it is necessary to maintain a good surface coverage of anhydrous HF molecules onto the surface of the oxide sacrificial layer.

The surface ratio, $v/v_m$ of the actual surface coverage of anhydrous HF adsorbed onto the oxide sacrificial layer, $v$, to the maximum amount of anhydrous HF that can be adsorbed as to form a complete monolayer, $v_m$, at an absolute temperature, T, follows the Brunauer-Emmet-Teller (BET) equation $$\frac{v}{v_m} = \left(\frac{c}{c-1}\right)\frac{P}{\left(1-\frac{P}{P_o}\right)\left(\frac{P_o}{c-1}+P\right)}$$

described in the following publication:
S. Brunauer, P. H. Emmet, E. Teller, "Adsorption of Gases in Multimolecular Layers", J. Am. Chem. Soc., 60, 1938, pp. 309-319;

and where:
P is the pressure above the oxide sacrificial layer;
$P_o$ is the vapour pressure of anhydrous HF at the absolute temperature, T;
c is a constant exponentially related to the heat of adsorption, $E_a$, of anhydrous HF onto the sacrificial oxide layer and to the heat of liquefaction, $E_l$, of anhydrous HF at the absolute temperature, T:

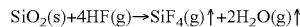

c' is another constant.

Figure 26:
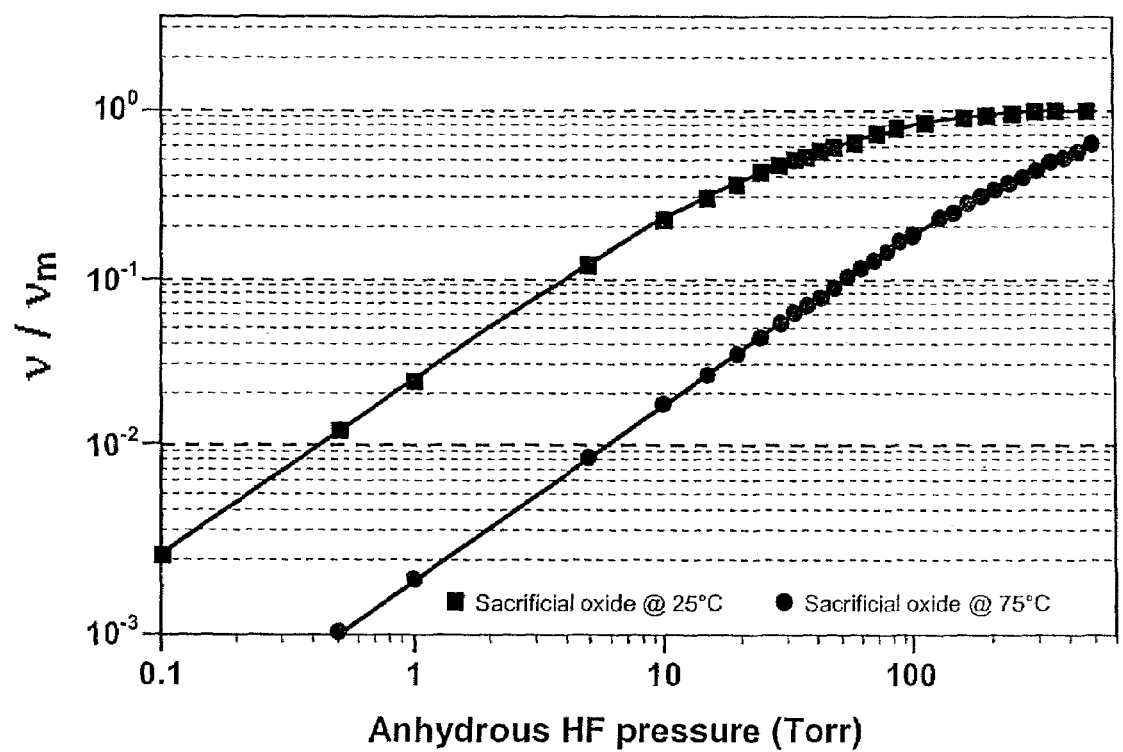
FIG. 26 shows the surface ratio, $v/v_m$, of the surface coverage of anhydrous HF adsorbed onto an oxide sacrificial layer, $v$ to the maximum coverage to form a complete monolayer, $v_m$, at 25° C. and 75° C. (C. S. Lee, 1996)

FIG. 26 shows the Brunauer-Emmet-Teller (BET) plot describing the relative surface coverage ratio, $v/v_m$, of anhydrous HF adsorbed onto the oxide sacrificial layer at a temperature of either 25° C. or 75° C. This FIG. 26 is a re-print of the data reported in the following publication:

C. S. Lee, J. T. Baek, H. J. Yoo, S. E. Woo, "Modeling and Characterization of Gas-Phase Etching of Thermal Oxide and TEOS Oxide Using Anhydrous HF and $CH_3OH$", J. Electrochem Soc., Vol. 143, No. 3, March 1996. pp. 1099-1103;

It is clear from this FIG. 26 that although an operation of the anhydrous HF release process at a pressure of less than the ammonium bifluoride, $NH_4HF_2$, triple point pressure of about 40 Torr and at the temperature of the highlighted grey zone of FIG. 24 could result in a residue-free removal of the oxide sacrificial layer and in a residue-free attack of the underlying silicon nitride etch-stop layer

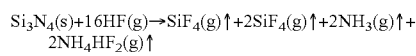

such release conditions of the sacrificial oxide results in a logarithmic reduction of the surface coverage of anhydrous HF raw material onto the surface of sacrificial oxide to be released; i.e. the BET plot of FIG. 26 indicates that a release process at a temperature of more than 100° C. and at a pressure of less than 40 Torr results in a very little surface coverage of anhydrous HF and, potentially, in a too slow release process to be used as a manufacturing process.

Figure 27:
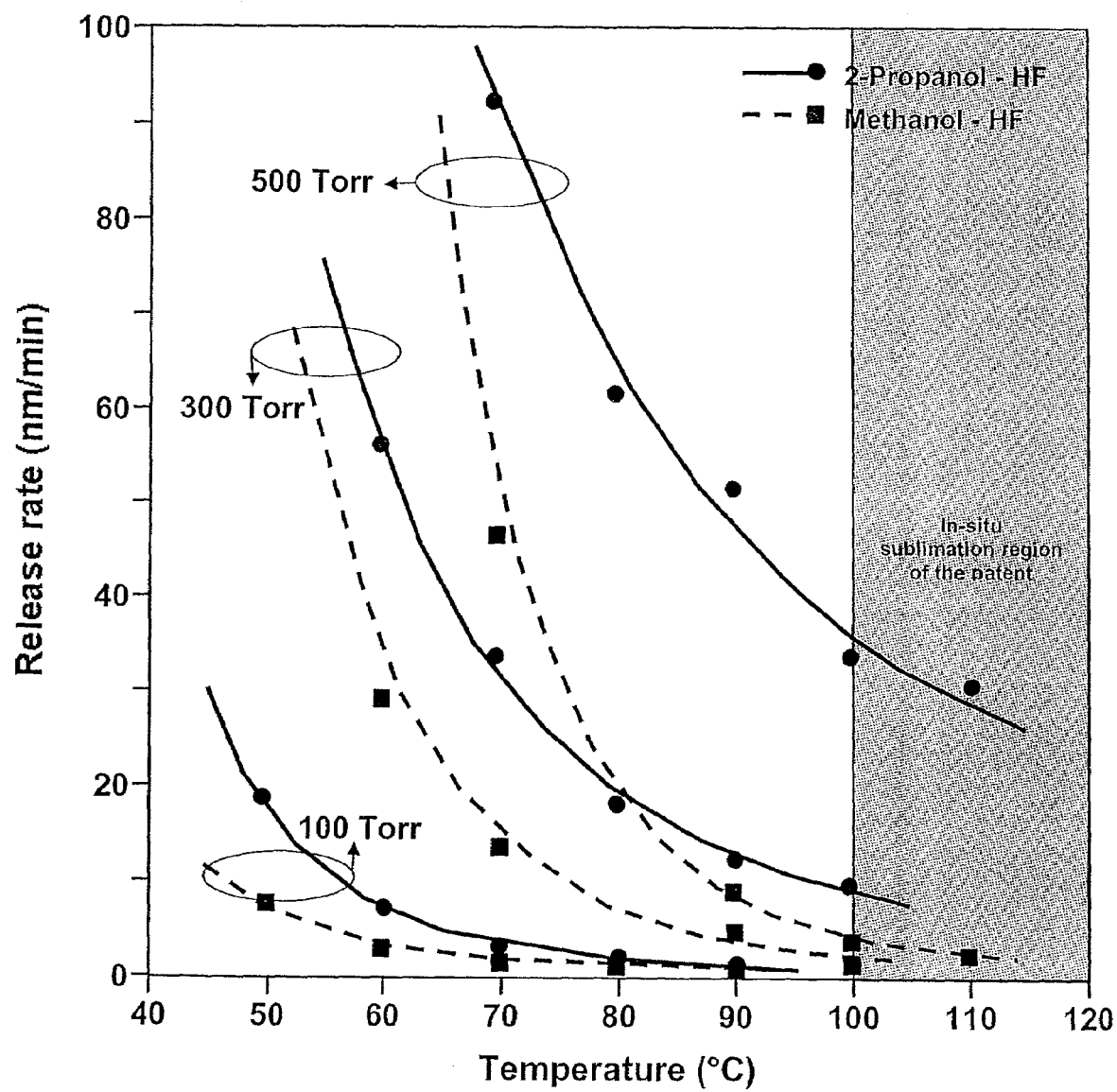
FIG. 27 shows the unacceptable reduction of release rate associated with an anhydrous HF process operating at a pressure less than the ammonium bifluoride, NH4HF2, triple point pressure of about 40 Torr and at the temperature of more than 100° C. (Torek, 1995).

This undesirable reduction of release rate due to the poor surface coverage of HF when operating the anhydrous HF release at a process pressure less than the ammonium bifluoride, $NH_4HF_2$, triple point pressure of about 40 Torr and at a process temperature within the highlighted grey zone of FIG. 24 is shown in FIG. 27 which shows a re-print of the results described in the following reference:

K. Torek, J. Ruzyllo, R. Grant, R. Novak, "Reduced Pressure Etching of Thermal Oxides in Anhydrous HF/Alcoholic Gas Mixtures", J. Electrochem Soc., Vol. 142, No. 4, April 1995, pp. 1322-1326;

FIG. 27 confirms the undesirable and unacceptable reduction of release rate associated to an anhydrous HF processes operating at a pressure of less than 40 Torr and at a temperature of more than 100° C. as to achieve a residue-free removal of sacrificial oxides at a pressure of less than the ammonium bifluoride, $NH_4HF_2$, triple point pressure of about 40 Torr and at the temperature of the highlighted grey zone of FIG. 24. This reduction of the release rate (at temperatures above 100° C.) to less than about 0.1 μm/minute (100 nm/minute) is indeed undesirable for the mass production of advanced MEMS devices because it is necessary to release the sacrificial oxide over a lateral distance typically ranging between 5 μm (50 minutes release at the minimum desirable rate of 0.1 μm/minute) and 200 μm (2,000 minutes or about 33 hours) underneath the suspended mechanical part as to free its movement. Referring again to FIG. 27, anhydrous HF processes operating at a temperature of more than 100° C. and at a pressure of less than 40 Torr as to achieve a residue-free removal of sacrificial oxides (the highlighted grey zone of FIG. 24) would imply undesirable release durations:

A 200 μm lateral release at a total pressure of 100 Torr (not yet the desirable maximum release pressure of 40 Torr) would take a minimum of about 100,000 minutes or 69 days to be completed at the expected release rate of 2 nm/minute and this, independently of the solvent used in combination to the anhydrous HF;

A 5 μm lateral release at a total pressure of 100 Torr (not yet the desirable maximum release pressure of 40 Torr) would still take a minimum of about 2,500 minutes or 42 hours to be completed at the expected release rate of 2 nm/minute and this, independently of the solvent used in combination to the anhydrous HF;

These very undesirable release durations show that it is not acceptable to perform the anhydrous HF release process at a pressure of less than 40 Torr and at a temperature of more than 100° C. to achieve a residue-free removal of sacrificial oxides at a pressure of less than the ammonium bifluoride, $NH_4HF_2$, triple point pressure of about 40 Torr and at the temperature of the highlighted grey zone of FIG. 24.

A custom-made batch release chamber capable of releasing up to 24 wafers simultaneously was constructed. This custom-made batch release chamber can be delivered attached to a cluster tool similar to the one shown in FIG. 14 which allows the connection of up to five (5) such batch release chambers and of up to two (2) independent vacuum cassette load stations around a central vacuum transfer chamber that can isolate the five (5) individual batch chambers from each other as well as the two (2) individual cassette elevators.

This batch chamber design allows the release of up to 24 wafers simultaneously and then relaxes the need for a fast release process. This batch chamber design allows the release at temperatures lower than 100° C. and/or pressures of more than 40 Torr to achieve faster release rates (FIG. 27) and, following proper release at a temperature of less than 100° C. and/or at a pressure of more than 40 Torr, allows the temperature to be increased to more than 100° C. and the pressure to be reduced to less than 40 Torr to achieve a residue-free removal of sacrificial oxides at a pressure of less than the ammonium bifluoride, $NH_4HF_2$, triple point pressure of about 40 Torr and at the temperature of the highlighted grey zone of FIG. 24.

This combination of a batch anhydrous HF release process (with or without solvents or alcohols) at temperatures lower than 100° C. and/or pressures of more than 40 Torr as to achieve faster release rates followed by an in-situ sublimation of undesirable reaction by-products at a temperature higher than 100° C. and at a pressure of less than 40 Torr as to achieve a residue-free removal of sacrificial oxides at a pressure of less than the ammonium bifluoride, $NH_4HF_2$, triple point pressure of about 40 Torr and at the temperature of the highlighted grey zone of FIG. 24 is the basis of one embodiment of the present invention.

The use of such a batch release chamber and of such a cluster tool configuration allows the anhydrous HF release to be performed at temperatures lower than 100° C. and/or pressures of more than 40 Torr as to achieve a release rate of at least 0.1 μm/minute:

$$SiO_2(s)+4HF(g) \rightarrow SiF_4(g)\uparrow+2H_2O(g)\uparrow$$

$$Si_3N_4(s)+16HF(g) \rightarrow 2(NH_4)_2SiF_6(s)+SiF_4(g)\uparrow$$

This minimum release rate of 0.1 μm/minute in such a custom-made batch chamber and in such a cluster tool equipped with five (5) anhydrous HF batch release chambers each capable of releasing up to 24 MEMS wafers simultaneously (for a total of 120 MEMS wafers that can be released simultaneously) is indeed acceptable for the mass production of advanced MEMS devices because the sacrificial oxide release over the same lateral distances ranging between 5 μm and 200 μm underneath the suspended mechanical part as to free its movement would imply acceptable release durations:

- A 200 μm lateral release at a minimum rate of 0.1 μm/minute would provide a net throughput of about 3.6 wafers per hour; i.e. 5 stations, each releasing 200 μm of sacrificial oxide on 24 wafers within 33 hrs;
- A 5 μm lateral release at a minimum rate of 0.1 μm/minute would provide a net throughput of about 144 wafers/hour; i.e. 5 stations, each releasing 5 μm of sacrificial oxide on 24 wafers within 50 minutes.

Such a spectacular increase of process throughput allows the cluster tool to be used for a controlled (without exposure to the moisten ambient atmosphere) in-situ sublimation of the undesirable reaction by-products at a temperature higher than 100° C. and at a pressure of less than 40 Torr as to achieve a residue-free removal of sacrificial oxides at a pressure of less than the ammonium bifluoride, $NH_4HF_2$, triple point pressure of about 40 Torr and at the temperature of the highlighted grey zone of FIG. 24 without too much penalty on the process throughput:

$$2(NH_4)_2SiF_6(s) \rightarrow 2NH_4HF_2(g)\uparrow+2SiF_4(g)\uparrow+2NH_3(g)\uparrow$$

This very important feature is key to the present invention because it allows the prevention of the indesirable effects of exposure of the silicon nitride reaction by-products to moisten ambient atmosphere and allows a clean release of the sacrificial oxide layer and an operator-safe and clean sublimation of the silicon nitride reaction by-products:

$$SiO_2(s)+4HF(g) \rightarrow SiF_4(g)\uparrow+2H_2O(g)\uparrow$$

$$Si_3N_4(s)+16HF(g) \rightarrow 2NH_4HF_2(g)\uparrow+3SiF_4(g)\uparrow+2NH_3(g)\uparrow$$

Embodiments of the invention offer a number of advantages over the prior art. The in-situ evaporation allows a residue-free etch of the sacrificial oxide layer covering an etch-stop silicon nitride underlayer, a residue-free release of the structural layer of a micro-electro-mechanical system (MEMS), an operator-safe etch the sacrificial oxide layer covering an etch-stop silicon nitride underlayer, an operator-safe release of the structural layer of a micro-electro-mechanical system (MEMS), a stiction-free etch of the sacrificial oxide layer covering an etch-stop silicon nitride underlayer, and a stiction-free release of the structural layer of a micro-electro-mechanical system (MEMS).

The method in accordance with the invention can be used to fabricate electro-mechanical systems integrating very sensitive moving mechanical parts, digital and/or analog CMOS control logic and/or high voltage CMOS drivers capable of performing actuation functions. The digital and/or analog CMOS control logic and/or high voltage CMOS drivers may integrate metal interconnects composed, for example, of aluminum, aluminum alloys, aluminium compounds, titanium, titanium alloys, titanium compounds, copper, gold, tungsten, tungsten alloys, tungsten compounds, molybdenum, molybdenum alloys, molybdenum compounds, or combinations of these.

We claim:

1. A method of making a MEMS device containing mechanical parts, comprising:
   etching away a sacrificial oxide layer covering an etch-stop silicon nitride underlayer to release said mechanical parts, which are formed on said sacrificial oxide layer, by exposing the sacrificial oxide layer to anhydrous HF at a temperature of less than about 100° C. and/or at a vacuum level greater than 40 Torr, said etching away of said sacrificial oxide layer on said silicon nitride layer leaving fluorine-containing ammonium etch byproducts resulting from said anhydrous HF attacking said underlying silicon nitride layer; and
   subsequently subjecting said etch by-products to a temperature of more than about 100° C. and at vacuum level lower than 40 Torr without exposure to ambient air to perform an in-situ vacuum sublimation of said etch by-products.

2. A method as claimed in claim 1, wherein the etch by-products comprise a chemical compound containing silicon, nitrogen, fluorine and hydrogen.

3. A method as claimed in claim 1, which is performed on wafers in a batch release process.

4. A method as claimed in claim 3, wherein said batch release process is implemented in a cluster tool.

5. A method as claimed in claim 1, wherein said in-situ sublimation of the etch by-products follows an in-situ decomposition thereof.

6. A method as claimed in claim 5, wherein the etch by-products comprise ammonium fluorosilicate, $(NH_4)_2SiF_6$, and the in-situ thermal decomposition of ammonium fluorosilicate, $(NH_4)_2SiF_6$, results in the in-situ sublimation of silicon tetrafluoride, $SiF_4(g)\uparrow$, ammonia, $NH_3(g)\uparrow$, and ammonium bifluoride, $NH_4HF_2\uparrow$.

7. A method as claimed in claim 6, wherein the in-situ sublimation of ammonium bifluoride, $NH_4HF_2\uparrow$, at a temperature of at least 100° C. is performed at a pressure lower than the critical pressure of ammonium bifluoride, $NH_4HF_2\uparrow$, at 100° C.

8. A method as claimed in claim 7, wherein in-situ sublimation of pressure of ammonium bifluoride, $NH_4HF_2\uparrow$, is less than 40 Torr.

9. A method as claimed in claim 1, wherein the micro-electro-mechanical system integrates moving mechanical pans, digital and/or analog CMOS control logic and/or CMOS drivers capable of performing actuation functions.

10. A method as claimed in claim 9, wherein providing metal interconnects for the digital and/or analog CMOS control logic and/or CMOS drivers.

11. A method as claimed in claim 10, wherein the metal interconnects are selected from the group consisting of: aluminum, aluminum alloys, aluminium compounds, titanium, titanium alloys, titanium compounds, copper, gold, tungsten, tungsten alloys, tungsten compounds, molybdenum, molybdenum alloys, molybdenum compounds, and combinations thereof.

12. A method as claimed in claim 1, wherein said etching away is performed in the presence of an organic volatile additive.

13. A method as claimed in claim 12, wherein the organic volatile additive is selected from the group consisting of: methanol, acetone, 1-buthanol, 2-buthanol, 1-propanol, 2-propanol and combinations thereof.

14. A method as claimed in claim 12, wherein the etch by-products result from the exposure of the etch-stop silicon nitride underlayer to anhydrous HF.

15. A method as claimed in claim 12, wherein the in-situ sublimation of the etch by-products follows an in-situ thermal decomposition.

16. A method as claimed in claim 12, which is performed on wafers in a batch release process.

17. A method as claimed in claim 12, wherein said batch release process is implemented in a cluster tool.

18. A method as claimed in claim 12, wherein the etch by-products comprise ammonium fluorosilicate, an in-situ thermal decomposition of ammonium fluorosilicate, $(NH_4)_2SiF_6$, results in the in-situ sublimation of silicon tetrafluoride, $SiF_4(g)\uparrow$, ammonia, $NH_3(g)\uparrow$, and ammonium bifluoride, $NH_4HF_2\uparrow$, and the in-situ thermal decomposition temperature of ammonium fluorosilicate, $(NH_4)_2SiF_6$, and the in-situ sublimation temperature of ammonium bifluoride, $NH_4HF_2\uparrow$, are at least 100° C.

19. A method as claimed in claim 18, wherein the in-situ sublimation of ammonium bifluoride, $NH_4HF_2\uparrow$, at a temperature of at least 100° C. is performed at a pressure lower than the critical pressure of ammonium bifluoride, $NH_4HF_2\uparrow$, at 100° C.

20. A method as claimed in claim 19, wherein the in-situ sublimation of pressure of ammonium bifluoride, $NH_4HF_2\uparrow$, is lower than about 40 Torr.

21. A method as claimed in claim 12, wherein the sacrificial etch is used to fabricate a micro-electro-mechanical system integrating moving mechanical pans, digital and/or analog CMOS control logic and/or CMOS drivers capable of performing actuation functions.

22. A method as claimed in claim 21, wherein metal interconnects are provided for the digital and/or analog CMOS control logic and/or CMOS drivers.

23. A method as claimed in claim 22, wherein the metal interconnects are selected from the group consisting of: aluminum, aluminum alloys, aluminium compounds, titanium, titanium alloys, titanium compounds, copper, gold, tungsten, tungsten alloys, tungsten compounds, molybdenum, molybdenum alloys, molybdenum compounds, and combinations of thereof.

* * * * *